US012560648B2

(12) United States Patent
Shi et al.

(10) Patent No.: US 12,560,648 B2
(45) Date of Patent: Feb. 24, 2026

(54) OPTICAL COUPLING OF PHOTONIC DEVICES

(71) Applicant: O-Net Communications (USA) Inc., San Jose, CA (US)

(72) Inventors: Zhong Shi, San Jose, CA (US); Leonid Frenkel, San Jose, CA (US); Hongbing Lei, San Jose, CA (US)

(73) Assignee: O-Net Communications (USA) Inc., San Jose, CA (US)

( * ) Notice: Subject to any disclaimer, the term of this patent is extended or adjusted under 35 U.S.C. 154(b) by 138 days.

(21) Appl. No.: 18/629,796

(22) Filed: Apr. 8, 2024

(65) Prior Publication Data

US 2025/0314694 A1     Oct. 9, 2025

(51) Int. Cl.
G01R 31/28        (2006.01)
G01R 31/26        (2020.01)
G01R 31/265       (2006.01)

(52) U.S. Cl.
CPC ..... G01R 31/2896 (2013.01); G01R 31/2656 (2013.01)

(58) Field of Classification Search
CPC ........................ G01R 31/2896; G01R 31/2656
See application file for complete search history.

(56) References Cited

U.S. PATENT DOCUMENTS

| | | | | |
|---|---|---|---|---|
| 5,864,643 A | * | 1/1999 | Pan | G02B 6/266 |
| | | | | 385/24 |
| 11,411,644 B2 | * | 8/2022 | Keck | H04B 10/0731 |
| 2005/0031255 A1 | * | 2/2005 | Schroeder | H04Q 11/0005 |
| | | | | 385/17 |
| 2022/0291142 A1 | * | 9/2022 | Mookherjea | G01N 21/1717 |

* cited by examiner

*Primary Examiner* — Eman A Alkafawi
*Assistant Examiner* — Suresh K Rajaputra
(74) *Attorney, Agent, or Firm* — Perkins Coie LLP

(57) ABSTRACT

Disclosed are methods, systems, and devices for testing a photonic device. An exemplary method as disclosed may include forming an optical pathway by positioning, based on an actuating signal, a component of the optical pathway, in which the component is one of a coupling fiber or a photonic device that collectively form the optical pathway; and causing, based on the actuating signal, a signal acquisition of a test signal that is derived from propagation of a source signal through the optical pathway such that the signal acquisition occurs substantially simultaneously with the adjustment of the component.

20 Claims, 8 Drawing Sheets

100

Source signal generator 190

110
Processor 112
Storage device 116

120
Coupling fiber positioning controller 122
126
Coupling fiber positioning stage 127A
Coupling fiber positioning actuator 127B 130
Signal routing device 132
Signal acquisition device 136

140
DUT stage controller 142
146
DUT stage 147A
DUT stage actuator 147B

300

310 Forming an optical pathway by positioning, based on an actuating signal, a component of the optical pathway 320 Causing, based on the actuating signal, a signal acquisition of a test signal that is derived from propagation of a source signal through the optical pathway

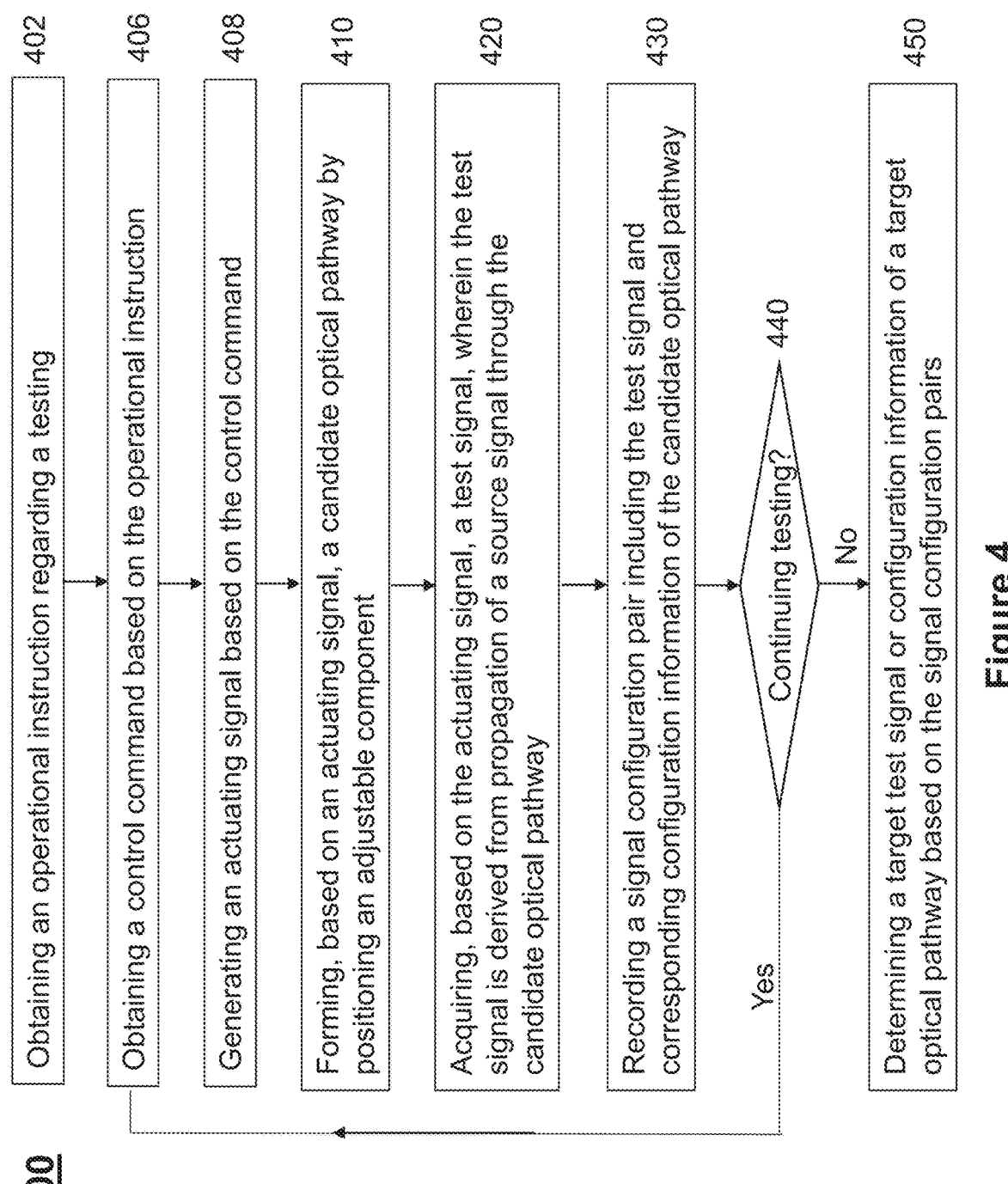

402 Obtaining an operational instruction regarding a testing

406 Obtaining a control command based on the operational instruction

408 Generating an actuating signal based on the control command

410 Forming, based on an actuating signal, a candidate optical pathway by positioning an adjustable component 420 Acquiring, based on the actuating signal, a test signal, wherein the test signal is derived from propagation of a source signal through the candidate optical pathway 430 Recording a signal configuration pair including the test signal and corresponding configuration information of the candidate optical pathway 440 Continuing testing?

Yes

No

450 Determining a target test signal or configuration information of a target optical pathway based on the signal configuration pairs

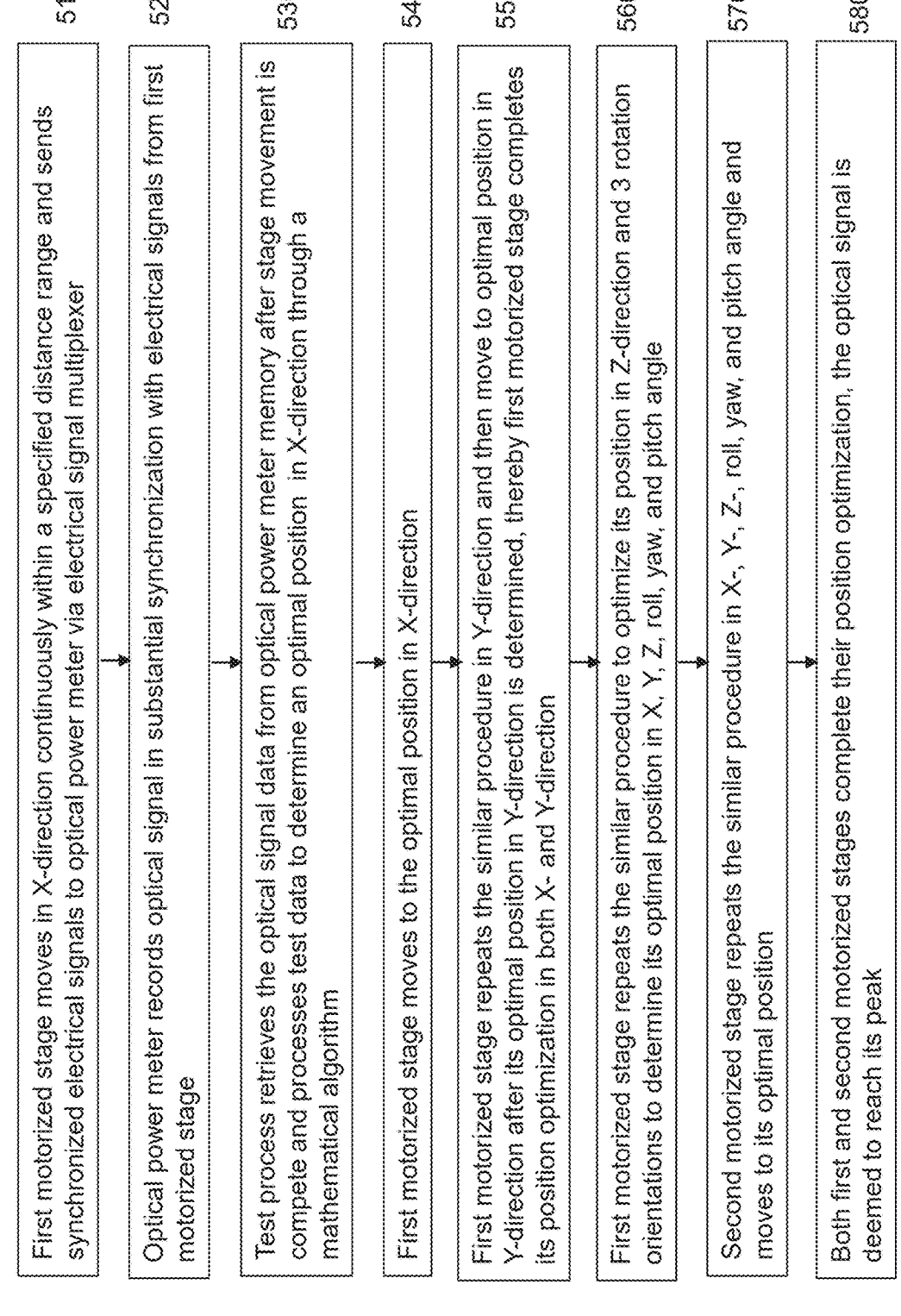

500

510 — First motorized stage moves in X-direction continuously within a specified distance range and sends synchronized electrical signals to optical power meter via electrical signal multiplexer 520 — Optical power meter records optical signal in substantial synchronization with electrical signals from first motorized stage 530 — Test process retrieves the optical signal data from optical power meter memory after stage movement is compete and processes test data to determine an optimal position in X-direction through a mathematical algorithm 540 — First motorized stage moves to the optimal position in X-direction 550 — First motorized stage repeats the similar procedure in Y-direction and then move to optimal position in Y-direction after its optimal position in Y-direction is determined, thereby first motorized stage completes its position optimization in both X- and Y-direction 560 — First motorized stage repeats the similar procedure to optimize its position in Z-direction and 3 rotation orientations to determine its optimal position in X, Y, Z, roll, yaw, and pitch angle 570 — Second motorized stage repeats the similar procedure in X-, Y-, Z-, roll, yaw, and pitch angle and moves to its optimal position 580 — Both first and second motorized stages complete their position optimization, the optical signal is deemed to reach its peak

Figure 5

OPTICAL COUPLING OF PHOTONIC DEVICES

TECHNICAL FIELD

This patent document relates to systems and methods for photonic devices, and more particularly systems and methods for optical coupling of photonic devices.

BACKGROUND

Optical coupling in the context of photonic devices, including photonic integrated circuits (PICs), refers to the transfer of light between different components that are optically coupled. Optical coupling enables light to be guided, modulated, amplified, or detected within an integrated circuit or between discrete devices.

SUMMARY

Disclosed are systems, methods for efficient testing of a photonic device, and/or improving or optimizing optical coupling of a photonic device with one or more other devices.

Some aspects of the present disclosure relate to a system for testing a photonic device. The system may include: an input fiber positioning assembly, an output fiber positioning assembly, a device under test (DUT) stage, a signal acquisition assembly, and a storage device. The input fiber positioning assembly may include: an input fiber positioning stage for holding an input fiber and operable to move in space to position the input fiber in a desired position and orientation; an input fiber positioning actuator configured to engage, and to move, the input fiber positioning stage for positioning the input fiber; and an input fiber positioning controller coupled to the input fiber positioning actuator and configured to control, by transmitting an input fiber positioning actuating signal to the input fiber positioning actuator, a movement of the input fiber positioning stage. The output fiber positioning assembly may include: an output fiber positioning stage for holding an output fiber and operable to move in space to position the output fiber in a desired position and orientation; an output fiber positioning actuator configured to engage, and to move, the output fiber positioning stage for positioning the output fiber; and an output fiber positioning controller coupled to the output fiber positioning actuator and configured to control, by transmitting an output fiber actuating signal to the output fiber positioning actuator, a movement of the output fiber positioning stage. The device under test (DUT) stage may be configured to hold a photonic device under test relative to the input fiber positioning assembly with the DUT to be exposed to incident light from the input fiber and the output fiber positioning assembly with the output fiber to allow the output fiber to collect light from the photonic DUT under illumination of the incident light from the input fiber. The signal acquisition assembly may include: a signal acquisition unit coupled to receive light from the output fiber to detect at least a portion of the light collected from the photonic DUT to generate a test signal that relates to placement of at least one of the input fiber or the output fiber with respect to the photonic DUT; and a signal routing device connected to at least one of the input fiber positioning controller or the output fiber positioning controller and configured to trigger a signal acquisition of the test signal by the signal acquisition unit based on at least one of the input fiber positioning actuating signal or the output fiber positioning actuating signal such that the signal acquisition is substantially synchronized with the movement of the input fiber positioning assembly or the movement of the output fiber positioning assembly. The storage device may be configured to obtain at least one of (a) the input fiber positioning actuating signal, a corresponding position of the input fiber positioning stage, or a corresponding placement of the input fiber, (b) the output fiber positioning actuating signal, a corresponding position of the output fiber positioning stage, or a corresponding placement of the output fiber, or (c) the test signal.

Some aspects of the present disclosure relate to a system for testing a photonic device. The system may include: a coupling fiber positioning assembly, a DUT stage, a signal acquisition assembly, and a storage device. The coupling fiber positioning assembly may include a coupling fiber positioning stage for holding a coupling fiber and operable to move in space to position the coupling fiber in a desired position and orientation; a coupling fiber positioning actuator configured to engage, and to move, the coupling fiber positioning stage for positioning the coupling fiber; and a coupling fiber positioning controller coupled to the coupling fiber positioning actuator and configured to control, by transmitting a coupling fiber positioning actuating signal to the coupling fiber positioning actuator, a movement of the coupling fiber positioning stage. The DUT stage may be configured to hold a photonic device under test relative to the coupling fiber positioning assembly, in which the photonic DUT and the coupling fiber are coupled to form an optical pathway. The signal acquisition assembly may include a signal acquisition unit configured to acquire, based on the coupling fiber positioning actuating signal, a test signal derived from propagation of a source signal through the optical pathway. The storage device may be configured to obtain the test signal and configuration information of the optical pathway, in which the configuration information relates to coupling of the coupling fiber and the photonic DUT.

Some aspects of the present disclosure relate to a method for testing a photonic item. The method may include: forming, based on a first actuating signal, a first candidate optical pathway by adjusting placement of an adjustable component of the first candidate optical pathway; and acquiring, based on the actuating signal, a first test signal, wherein the first test signal is derived from propagation of a source signal through the first candidate optical pathway; recording a first signal configuration pair including the first test signal and configuration information of the first candidate optical pathway; forming, based on a second actuating signal, a second candidate optical pathway by adjusting placement of the adjustable component; acquiring, based on the second actuating signal, a second test signal, wherein the second test signal is derived from propagation of the source signal through the second candidate optical pathway; recording a second signal configuration pair including the second test signal and configuration information of the second candidate pathway; and determining a target test signal or target configuration information based on the first and second signal configuration pairs.

Some aspects of the present disclosure relate to a method for testing a photonic item. The method may include: forming an optical pathway by positioning, based on an actuating signal, a component of the optical pathway, in which the component is one of a coupling fiber or a photonic device that collectively form the optical pathway; and causing, based on the actuating signal, a signal acquisition of a test signal that is derived from propagation of a source signal through the optical pathway such that the signal acquisition occurs substantially simultaneously with the adjustment of the component.

Some aspects of the present disclosure relate to a method for testing a photonic item. The method may include: receiving an operational instruction relating to a plurality of test positions of an input fiber positioning stage; generating, based on the operational instruction, a plurality of control commands corresponding to the plurality of test positions; causing, based on the plurality of control commands, a controller to generate a plurality of actuating signals; causing the input fiber positioning stage to sequentially traverse, by an actuator in response to the plurality of actuating signals, the plurality of test positions; causing a signal acquisition assembly to acquire, in response to the plurality of actuating signals, a plurality of test signals substantially simultaneously while the input fiber positioning stage sequentially traverses the plurality of test positions, each of the plurality of test signals corresponding to a source signal after the source signal propagates through an optical pathway formed by coupled components including an input fiber secured on the input fiber positioning stage, a photonic item, and an output fiber; and identifying, from the plurality of test signals and based on a selection condition, (i) a target test signal or (ii) target configuration information of the optical pathway.

BRIEF DESCRIPTION OF THE DRAWINGS

FIG. 4 illustrates a flowchart of a process for testing a photonic item according to some embodiments of the present document.

FIG. 5 illustrates a flowchart of a process for testing a photonic item according to some embodiments of the present document.

The drawings are not to scale. Like reference numerals denote like components or operations.

DETAILED DESCRIPTION

Figure 1:
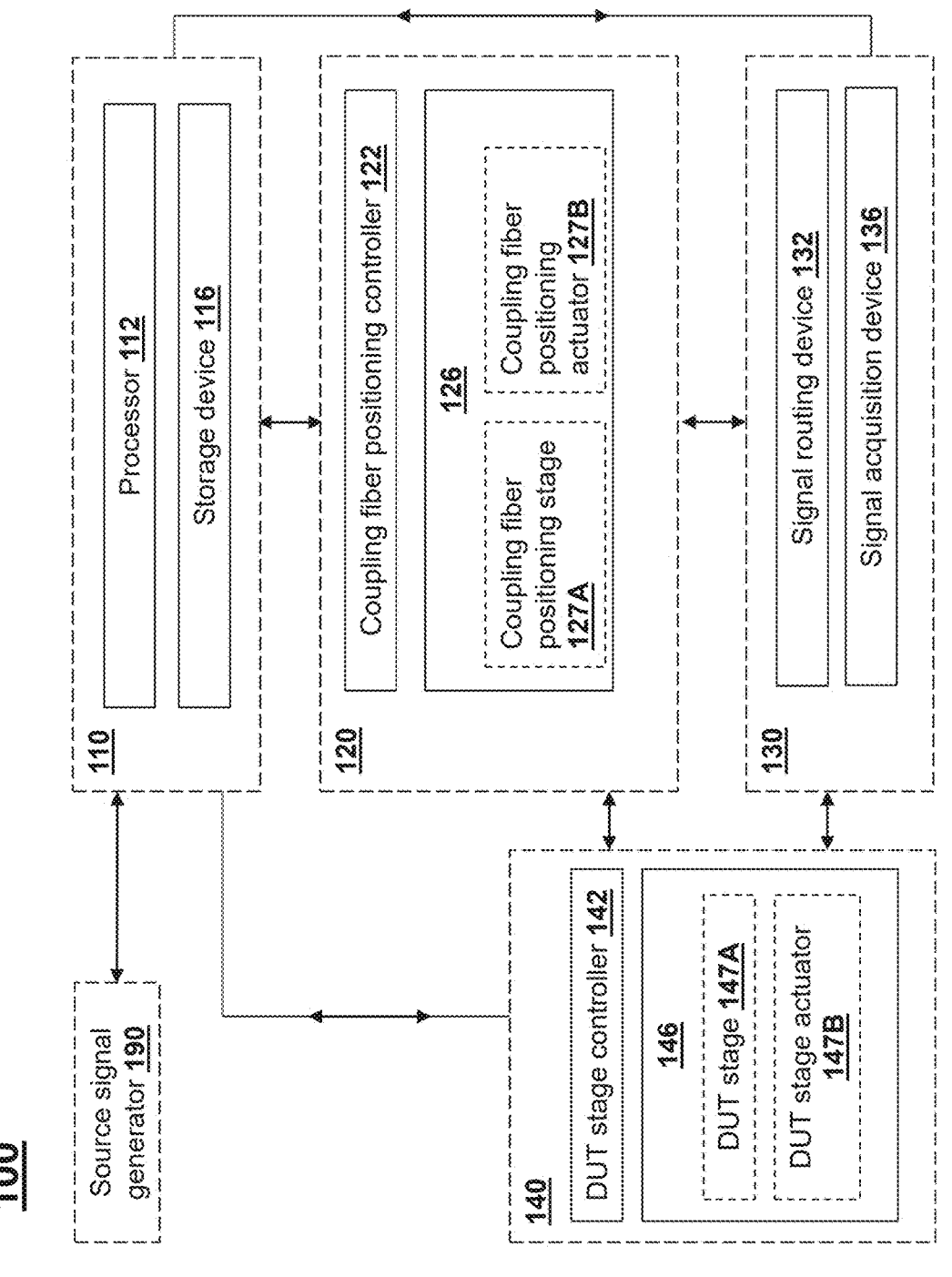
FIG. 1 illustrates a system for testing a photonic device in accordance with some embodiments of the present document.

Disclosed are systems and methods for improving or optimizing optical coupling of a photonic device with one or more other devices. Optimized optical coupling may reduce or minimize insertion losses and ensure high performance of photonic devices. It may be achieved by precise alignment of such a photonic device with one or more other devices to form an optimized optical pathway. Optical coupling optimization may be performed in various scenarios including, e.g., photonic integrated circuit (PIC) testing, PIC device packaging, etc. In the present document, the terms including "photonic item," "photonic device," and "photonic device under test" may be used interchangeably.

An optical signal from a fiber can be efficiently focused and coupled into a photonic device (e.g., a photonic integrated circuit (PIC)) through an input port. This signal may then propagate within the photonic device and be coupled out to a fiber—such as a fiber array or a fiber-lens assembly—via an output port. The input port and/or the output port may be a coupler, e.g., a grating coupler, an edge coupler. The efficiency of optical coupling may directly influence the insertion loss in an optical device. This, in turn, can have a significant impact on the yield and cost of the final product incorporating the PIC device.

As a process to improve or optimize optical coupling efficiency, a photonic device (e.g., a PIC, or a sub-assembly device (also known as a PIC chip on sub-mount)) may be mounted on a motorized stage, and fibers (e.g., a fiber array, or fiber-lens-assembly) may be mounted on another (or more) motorized stage. The process may involve scanning positions of fibers (e.g., fiber arrays, or fiber-lens-assemblies) in three-dimensional space (x, y, z, roll angle, yaw angle and pitch angle). By dynamically adjusting the positions of the photonic device and/or the fibers, and measuring the optical or electrical signals at each position, the system may identify the optimal alignment for maximum signal strength(s) among the measured optical or electrical signals at the positions. This optimization may be facilitated by a computer algorithm configured to analyze the data to determine one or more positions yielding the highest signal level(s), where fibers (e.g., a fiber array, or a fiber-lens-assembly) can then be placed for further processing or use.

An existing optical coupling optimization process may involve a three-dimensional position scanning process and an optical or electrical signal measurement and read out for each scanning position. For example, a computer controls the motorized stage controllers and the optical power meter separately, and there is no direct communication between them. The computer sends out a command to at least one of the motorized stage controllers, which drives a motorized stage connected to the controller to move. After the stage movement is complete, the computer sends out another command to the optical power meter (or source-meter unit) to measure the optical power (or electrical current or voltage). Then the computer sends out a third command to retrieve the measurement data from the memory unit of the optical power meter or source-meter unit. This process repeats across three-dimensional space ranges (x, y, z, roll angle, yaw angle, and pitch angle) defined by a computer program. A computer algorithm may determine the optimal coupling position(s) by post-processing the measurement data after the scanning process is complete.

The existing coupling optimization process is time-consuming due to the separate control of the motorized stages and the measurement instruments (e.g., an optical power meter or source-meter unit) by the test software, lacking direct communication between them. This inefficiency slows down photonic device testing or packaging processes, leading to increased costs, particularly given the high expense of existing testing and packaging equipment.

To address these and other technical challenges, some embodiments of the present document disclose an improved system and method that may streamline optical coupling optimization between fibers (e.g., a fiber array or fiber-lens assembly) and a photonic device (e.g., a PIC at die-level or wafer-level). According to some embodiments, this technology links the movement of motorized stages directly with the activation of an optical power meter (or source-meter unit), allowing signal acquisition to occur substantially simultaneously with the movement of the motorized stages. Merely by way of example, a motorized stage controller sends out an actuating signal (e.g., an electrical signal) internally to drive the movement of the motorized stage in the three-dimensional space (x, y, z, roll angle, yaw angle and pitch angle). The technology disclosed herein exploits the actuating signals and multiplexes the actuating signals from the motorized stage controllers. In some embodiments, the multiplexed actuating signals are fed to an optical power meter or source-meter as trigger signals to perform optical or electrical signal measurement in a single shot within the pre-defined stage movement ranges. The multiplexing function can be realized using, e.g., an electrical "OR" gate chip which can multiple electrical signals together and has the advantage of scalability, especially considering the parallel test of multiple devices together. The technology may avoid the typical slow optical coupling process in measuring and acquiring data for each movement step of the motorized stage(s). Therefore, the measurement time may be significantly reduced by, e.g., a few times and the optical signal (or electrical signal) measurement efficiency may be significantly improved.

The direct communications between the motorized stage controller and the optical power meter as disclosed herein may allow for multiplexing the electrical signals from the motorized stage controller to trigger optical power meter (or source-meter unit) to measure optical (or electrical) signal in a single shot. The full set of measurement data may be ready to be retrieved by the time the motorized stage movement is completed. The full set of measurement data is read out from the memory unit of optical power meter (or source-meter) after the motorized stage completes its movement and the optimal positions are determined by post-processing the measurement data by a computer algorithm. A computer program may collect the measurement data in one go, and optimal coupling positions may be identified through an algorithm. The positions of the fibers (fiber array or fiber-lens assembly) may then be positioned accordingly to achieve improved or maximum coupling efficiency. This process according to some embodiments of the present document may accelerate the optimization of optical coupling, significantly reducing the costs associated with testing or packaging photonic devices (e.g., PIC devices).

FIG. 1 illustrates a system for testing a photonic device in accordance with some embodiments of the present document. The system 100 may include a computing device 110, a coupling fiber positioning assembly 120, a signal acquisition assembly 130, a device under test (DUT) positioning assembly 140, and a source signal generator 190.

The computing device 110 may be configured to control the operation of the system 100 and/or analyze data acquired therefrom. For example, the computing device 110 may receive an operational instruction regarding a testing of a photonic device using the system 100. The operational instruction may generate control commands based on the operational instruction to cause the system 100 to perform the testing accordingly. The computing device 110 may obtain data from the testing for storage (e.g., at the storage device(s) 116, or one or more external storage devices) and/or processing (e.g., by the processor(s) 112, or one or more external local or remote processors). The computing device 110 may generate the control commands and/or handle the data acquired from the testing based on one or more algorithms stored in or accessible from the computing device 110.

To test the photonic device (e.g., to assess the optical performance or characteristics of the photonic device), an optical pathway may be formed by optically coupling the photonic device with one or more coupling fibers. The computing device 110 may obtain a test signal derived from the propagation of a source signal through the optical pathway. The test signal may include an optical signal exiting the optical pathway, an electrical signal relating to such an optical signal, etc. The computing device 110 may obtain configuration information of the optical pathway. The configuration information of the optical pathway may include placement of the one or more coupling fibers, placement of the photonic device, a control command or a corresponding signal (e.g., a corresponding actuating signal, a feedback signal) relating to a position of a motorized coupling fiber positioning stage 126 (additional description may be found elsewhere in the present document) where one of the one or more coupling fibers is secured, a control command or a corresponding actuating signal relating to a position of a motorized DUT stage 146 (additional description may be found elsewhere in the present document) where the photonic device is secured, or the like, or a combination thereof. Additional description regarding the placement of a coupling fiber may be found elsewhere in the present document.

In various implementations, the computing device 110 may be a local system or communication network accessible via the Internet (referred to as "the cloud") including servers and/or databases in the cloud, and/or one or more mobile computing devices, such as a smartphone, tablet, or wearable computer device including a smartwatch or smart-glasses. The computing device 110 may include at least one processor 112 and at least one storage device 116. The at least one processor 112 may be configured to process data. The at least one storage device 116 may be integrated with or in communication with the at least one processor 112 to store and/or buffer data. For example, the at least one processor 112 can include a central processing unit (CPU) or a microcontroller unit (MCU). In some implementations, the at least one processor 112 can include a field-programmable gate-array (FPGA) or a graphics processing unit (GPU). For example, the at least one storage device 116 may include non-transitory storage media that electronically stores information. The electronic storage media of the at least one storage device 116 may include one or both of (i) system storage that is provided integrally (e.g., substantially non-removable) with the at least one processor 112 (e.g., one or more servers or client devices), or (ii) removable storage that is removably connectable to the at least one processor 112 via, for example, a port (e.g., a USB port, a firewire port, etc.) or a drive (e.g., a disk drive, etc.). The at least one storage device 116 may include one or more of optically readable storage media (e.g., optical disks, etc.), magnetically readable storage media (e.g., magnetic tape, magnetic hard drive, floppy drive, etc.), electrical charge-based storage media (e.g., electrically erasable programmable read-only memory (EEPROM), random-access memory (RAM), etc.), solid-state storage media (e.g., flash drive, etc.), and/or other electronically readable storage media. The electronic storages may include one or more virtual storage resources (e.g., cloud storage, a virtual private network, and/or other virtual storage resources). The at least one storage device 116 may store software algorithms, information determined by the processors, information obtained from the at least one processor 112, information obtained from other components of the system 100 (e.g., the coupling fiber positioning assembly 120, the signal acquisition assembly 130) or client devices, or other information that enables the functionality as described herein.

In some implementations, the computing device 110 may include an input/output (I/O) unit to interface the at least one processor 112 and/or the at least one storage device 116 to other modules, units or devices. In some embodiments, such as for mobile computing devices, the computing device 110 may include a wireless communications unit, e.g., such as a transmitter (Tx) or a transmitter/receiver (Tx/Rx) unit. For example, in such embodiments, the I/O unit can interface the at least one processor 112 and/or at least one storage device 116 of the computing device 110 with the wireless communications unit, e.g., to utilize various types of wireless interfaces compatible with typical data communication standards, which can be used in communications of the computing device 110 with other devices, e.g., such as between the one or more computers in the cloud and the user device. The data communication standards include, but are not limited to, Bluetooth, Bluetooth low energy (BLE), Zigbee, IEEE 802.11, Wireless Local Area Network (WLAN), Wireless Personal Area Network (WPAN), Wireless Wide Area Network (WWAN), WiMAX, IEEE 802.16 (Worldwide Interoperability for Microwave Access (WiMAX)), 3G/4G/LTE/5G cellular communication methods, and parallel interfaces. In some implementations, the computing device 110 can interface with other devices using a wired connection via the I/O unit. The computing device 110 can also interface with other external interfaces, sources of data storage, and/or visual or audio display devices, etc. to retrieve and transfer data and information that can be processed by the processor, stored in the memory, or exhibited on an output unit of a display device or an external device.

The coupling fiber positioning assembly 120 may be configured to position a coupling fiber, or a portion thereof (e.g., an input fiber 262A, an input fiber coupler 262B, an output fiber 264A, an output fiber coupler 264B, etc.). In some embodiments, the coupling fiber positioning assembly 120 may position a coupling fiber for optically connecting it with a photonic device to form an optical pathway via which an optical signal may be transmitted to or away from the photonic device. The coupling fiber positioned assembly 120 may be an input fiber positioning assembly configured to position an input fiber relative to a device under test (DUT), e.g., a photonic DUT, such that the DUT is exposed to incident light from the input fiber. The coupling fiber positioned assembly 120 may be an output fiber positioning assembly configured to position an output fiber relative to the DUT to allow the output fiber to collect light from the DUT under illumination of the incident light from the input fiber. In some embodiments, the system 100 may include two coupling fiber positioning assemblies 120 as exemplified in FIGS. 2A and 2B, one as the input fiber positioning assembly configured to position an input fiber relative to the DUT, and the other as the output fiber positioning assembly configured to position an output fiber relative to the DUT. In some embodiments, the system 100 may include one coupling fiber positioning assembly 120 as exemplified in FIGS. 2C and 2D.

The placement of a coupling fiber, or a portion thereof, may affect how the coupling fiber is aligned or situated relative to the photonic device to facilitate light transfer. The placement of a coupling fiber may include information regarding its position and angular orientation. For example, the placement of a coupling fiber may include or relate to an axial alignment, a lateral offset, a vertical offset, a tilt angle, rotation of the coupling fiber around its own axis, a working distance, or the like, or a combination thereof. The axial alignment may refer to the position of the coupling fiber along the optical axis of the photonic device or the optical axis of the optical pathway. The lateral offset may refer to the distance between the center of the coupling fiber and the center of the input port or output port of the photonic device in a plane perpendicular to the optical axis of the optical pathway. The working distance may refer to the gap between the input port of the photonic device and an end of the coupling fiber that opposes or is coupled with the input port.

The placement of the coupling fiber may affect the configuration of a signal traversing the coupling fiber including, e.g., the direction of the signal, the shape of the light beam of the signal, the intensity, the focus, etc., which in turn may affect the propagation of the signal through a coupled component (e.g., the photonic device). Accordingly, by adjusting the placement of the coupling fiber, the optical coupling between the coupling fiber and the photonic device may be adjusted, which in turn may lead to different optical performance of the photonic device.

The coupling fiber positioning assembly 120 may include a coupling fiber positioning controller 122 and a motorized coupling fiber positioning stage 126. The coupling fiber positioning controller 122 may be configured (e.g., programed) to generate an actuating signal based on a control command. In some embodiments, the coupling fiber positioning controller 122 may be configured to provide a feedback signal regarding execution of the control command and/or the operation or condition of itself or a component connected to it. The coupling fiber positioning controller 122 may be implemented on a microcontroller (e.g., Arduino, Raspberry Pi), a programmable logic controller (PLC), or a digital signal processor (DSP). The actuating signal may be a pulse. For example, an actuating signal may control the speed and/or direction of an actuator by varying the width of the pulse sent to an actuator of the coupling fiber positioning assembly 120 (e.g., a coupling fiber positioning actuator 127B as described elsewhere in the present document). Upon receiving an actuating signal, the actuator may convert it into mechanical motion in a predetermined manner.

The motorized coupling fiber positioning stage 126 may include a coupling fiber positioning stage 127A and a coupling fiber positioning actuator 127B connected to the coupling fiber positioning stage 127A. The coupling fiber positioning stage 127A may be configured to secure a coupling fiber such that a placement of the coupling fiber may be achieved or adjusted by moving the coupling fiber positioning stage 127A. For example, the coupling fiber positioning stage 127A may include mounting hardware for securing the coupling fiber thereon. Examples of the mounting hardware may include a fiber holder fixedly attached on the coupling fiber positioning stage 127A. The coupling fiber positioning actuator 127B may include a piezoelectric actuator, a servo motor, a stepper motor, an electromagnetic actuator, a linear actuator, or the like, or a combination thereof. Upon receiving an actuating signal, the coupling fiber positioning actuator 127B may convert it into mechanical motion, moving the coupling fiber positioning stage 127A in a predetermined manner in space to position the coupling fiber at a desired position and orientation.

The motorized coupling fiber positioning stage 126 may physically move a coupling fiber mounted on the coupling fiber positioning stage 127A. For example, the coupling fiber positioning controller 122 may receive a control command from the computing device 110 and generate an actuating signal for driving the coupling fiber positioning actuator 127B to move the coupling fiber positioning stage 127A, thereby positioning a coupling fiber secured on the stage 127A to achieve a placement of the coupling fiber. In some embodiments, the motorized coupling fiber positioning stage 126 may be configured to move in six degrees of freedom including three linear degrees of freedom (x, y, z) and three rotational degrees of freedom (pitch, yaw, roll). By feeding a series of actuating signals sequentially to the coupling fiber positioning actuator 127B, the coupling fiber positioning stage 127A may sweep through a series of positions automatically without interruption; the coupling fiber secured thereon may exhibit a plurality of placements, causing the optical pathway to go through a series of configurations.

The signal acquisition assembly 130 may be configured to acquire a test signal derived from propagation of a source signal through an optical pathway formed by the photonic device and one or more coupling fibers. The signal acquisition assembly 130 may include a signal routing device 132 and a signal acquisition device (or referred to as a signal acquisition unit) 136. The signal routing device 132 may be configured to trigger the signal acquisition device 136 to acquire a signal. In some embodiments, the signal routing device 132 may be connected to the coupling fiber positioning controller 122. When the coupling fiber positioning controller 122 transmits an actuating signal to the coupling fiber positioning actuator 127B which may cause the motorized coupling fiber positioning stage 126 to move, the coupling fiber positioning controller 122 may also transmit the actuating signal to the signal routing device 132 which may trigger the signal acquisition device 136 to acquire a test signal. Accordingly, the movement of the motorized coupling fiber positioning stage 126 and the acquisition of a corresponding test signal may occur substantially simultaneously in response to the same actuating signal. By feeding a series of actuating signals sequentially to the coupling fiber positioning actuator 127B and the signal routing device 132, the coupling fiber positioning stage 127A may sweep through a series of positions automatically without interruption such that the coupling fiber secured thereon may exhibit a plurality of placements, causing the optical pathway to go through a series of configurations; meanwhile, the signal acquisition device 136 may acquire, automatically without interruption, test signals corresponding to the positions of the coupling fiber positioning stage 127A, the placements of the coupling fiber, and/or the configurations of the optical pathway.

The signal routing device 132 may include a multiplexer (e.g., an electrical signal time multiplexer), a relay (e.g., an electromechanical or solid-state relay), a programmable logic device (PLD, e.g., a FPGA, a complex programmable logic device (CPLD)), etc. The signal routing device 132 may be configured to output a signal to trigger the signal acquisition device 136 to perform a signal acquisition based on one or more input signals.

The signal acquisition device 136 may be configured to acquire a test signal. The signal acquisition device 136 may include an optical power meter, a source measure unit, an oscilloscope, a digital multimeter (DMM), a spectrum analyzer, or the like, or a combination thereof. Merely by way of example, the test signal may be an optical signal; accordingly, the signal acquisition device 136 may be an optical power meter. As another example, the test signal may be an electrical signal (e.g., an electrical signal generated by converting an optical signal exiting the optical pathway and subject to optical-electrical signal conversion using, e.g., a photodiode); accordingly, the signal acquisition device 136 may be an electrical signal meter (e.g., a DMM, an oscilloscope, a spectrum analyzer, etc.).

The signal acquisition device 136 may send the acquired data (e.g., test signals) to the computing device 110 for storage (e.g., at the storage device(s) 116, or one or more external storage devices) and/or processing (e.g., by the processor(s) 112, or one or more external local or remote processors). In some embodiments, the computing device 110 may provide an instruction to the signal acquisition assembly 130. Merely by way of example, the computing device 110 may send an instruction directly to the signal routing device 132 and/or the signal acquisition device 136 to control the operation (e.g., by overwriting an actuating signal from the coupling fiber positioning controller 122 for safety and/or other considerations).

The DUT positioning assembly 140 may be configured to position a device under test, e.g., a photonic device under test. In some embodiments, the DUT positioning assembly 140 may position the photonic device for optically connecting it with one or more coupling fibers to form an optical pathway via which a source signal may be transmitted to the photonic device. The DUT positioning assembly 140 may include a DUT stage controller 142 and a motorized DUT stage 146.

The DUT stage controller 142 may be configured (e.g., programmed) to generate an actuating signal based on a control command. In some embodiments, the DUT stage controller 142 may be configured to provide a feedback signal regarding execution of the control command and/or the operation or condition of itself or a component connected to it. The DUT stage controller 142 may be implemented on a microcontroller (e.g., Arduino, Raspberry Pi), a programmable logic controller (PLC), or a digital signal processor (DSP). The actuating signal may be a pulse. For example, an actuating signal may control the speed and/or direction of an actuator by varying the width of the pulse sent to an actuator of the DUT positioning assembly 140 (e.g., a DUT stage actuator 147B as described elsewhere in the present document).

The motorized DUT stage 146 may include a DUT stage 147A and a DUT stage actuator 147B connected to the DUT stage 147A. The DUT stage 147A may be configured to secure a DUT (e.g., a photonic device) such that a placement of the photonic device may be achieved or adjusted by moving the DUT stage 147A. For example, the DUT stage 147A may include mounting hardware for securing the DUT thereon. Examples of the mounting hardware may include a holder fixedly attached on the DUT stage 147A. The DUT stage 147A may be configured to conveniently placing and/or replacing a DUT so that different DUTs may be positioned on the motorized DUT stage 146 and tested using the system 100.

The motorized DUT stage 146 may physically move a DUT mounted on the DUT stage 147A. For example, the DUT stage controller 142 may receive a control command from the computing device 110 and generate an actuating signal for driving the DUT stage actuator 147B to move the DUT stage 147A, thereby positioning the DUT secured on the stage 147A to achieve a placement of the DUT. In some embodiments, the motorized DUT stage 146 may be configured to move in one or more of six degrees of freedom including three linear degrees of freedom (x, y, z) and three rotational degrees of freedom (pitch, yaw, roll). The DUT stage actuator 147B may include a piezoelectric actuator, a servo motor, a stepper motor, an electromagnetic actuator, a linear actuator, or the like, or a combination thereof.

The DUT positioning assembly 140 may be controlled and/or moved independently of the coupling fiber positioning assembly 120. Merely by way of example, the DUT positioning assembly 140 and the DUT secured thereon may remain stationary when the coupling fiber positioning assembly 120 and the coupling fiber secured thereon sweep through a series of positions to conduct a test of the DUT. As another example, the DUT positioning assembly 140 may be adjusted to properly position a DUT secured thereon for testing; after the positioning of the DUT is complete, the coupling fiber positioning assembly 120 and the coupling fiber secured thereon may be caused to sweep through a series of positions as part of the test procedure.

The source signal generator 190 may be configured to generate a source signal with a known signal configuration. A source signal may exhibit a signal configuration having a specific power output, wavelength, a beam divergence, or the like, or a combination thereof. The source signal generator 190 may include a laser configured to generate a laser output as the source signal. Merely by way of example, the source signal generator 190 may be a versatile laser configured to generated source signals of different configurations. The computing device 110 may provide an instruction according to which the source signal generator 190 may generate a source signal. The instruction may provide information including the wavelength or frequency of the laser output (e.g., fixed, tunable, or multi-wavelength); the power or intensity of the laser output (e.g., constant, variable, or controlled by a feedback mechanism); the pulse duration, repetition rate, shape, or energy of the laser output, if the laser is pulsed or modulated; the beam quality, divergence, polarization, or coherence of the laser output (which may affect the spatial and temporal characteristics of the source signal), or the like, or a combination thereof. The source signal generated accordingly may exhibit one or more properties including an amplitude, frequency, phase, spectrum, polarization, coherence, pulse width, or the like, or a combination thereof. The source signal generator 190 may provide feedback to the computing device 110 regarding the execution of the instruction and/or the operation or condition of itself or a component connected to it.

The system 100 may perform an automated and continuous testing procedure. The computing device 110 may obtain an operational instruction regarding the testing. For example, the operational instruction may include information such as test positions to be traversed by the coupling fiber positioning stage 127A or corresponding placements of the coupling fiber. The computing device 110 may generate a series of control commands based on the operational instruction. The computing device 110 may transmit the controller commands to the coupling fiber positioning controller 122. Based on a controller command, the coupling fiber positioning controller 122 may generate an actuating signal configured to trigger two actions, one action by the coupling fiber positioning actuator 127B to move the coupling fiber positioning stage 127A, and the other action by the signal acquisition device 136 to acquire a test signal. The two actions triggered by a same actuating signal (and corresponding to a same control command) may occur substantially simultaneously. The group of operations including receiving a control command, generating an actuating signal, and synchronized operations of the coupling fiber positioning actuator 127B/the coupling fiber positioning stage 127A and the signal acquisition device 136 may repeat continuously without interruption. A cycle of the group of operations may generate a signal configuration pair including a test signal and the corresponding configuration information of the optical pathway. Each cycle may be initiated by a new control command. The system 100 may perform multiple cycles and obtain multiple signal configuration pairs for storage (e.g., at the storage device(s) 116, or one or more external storage devices) and/or processing (e.g., by the processor(s) 112, or one or more external local or remote processors). This is different from an existing process in which in one cycle, the operation of the coupling fiber positioning actuator 127B/the coupling fiber positioning stage 127A and the operation of the signal acquisition device 136 are controlled separately such that the two operations occur one after another (e.g., signal acquisition occurs after the stage movement is complete while the stage stays stationary and wait for the signal acquisition to occur), and therefore is much more time-consuming.

The description of the system 100 provided above is for illustration purposes only and not intended to be limiting. One or more features may be added to or omitted from the system 100. For example, the system 100 may include two coupling fiber positioning assemblies similar to the coupling fiber positioning assembly 120; the two coupling fiber positioning assemblies may be configured to position the input fiber and the output fiber for optically connecting them with a photonic device, thereby collectively forming an optical pathway for testing the optical performance of the photonic device. In some embodiments, the two coupling fiber positioning assemblies may be controlled and/or move independently. As another example, the DUT positioning assembly 140 may be fixed in position, or can move in fewer degrees of freedom than the coupling fiber positioning assembly 120. As a further example, the computing device 110 may be implemented locally or remotely. As still a further example, the computing device 110 may be configured in a centralized or distributed manner.

Figure 2A:
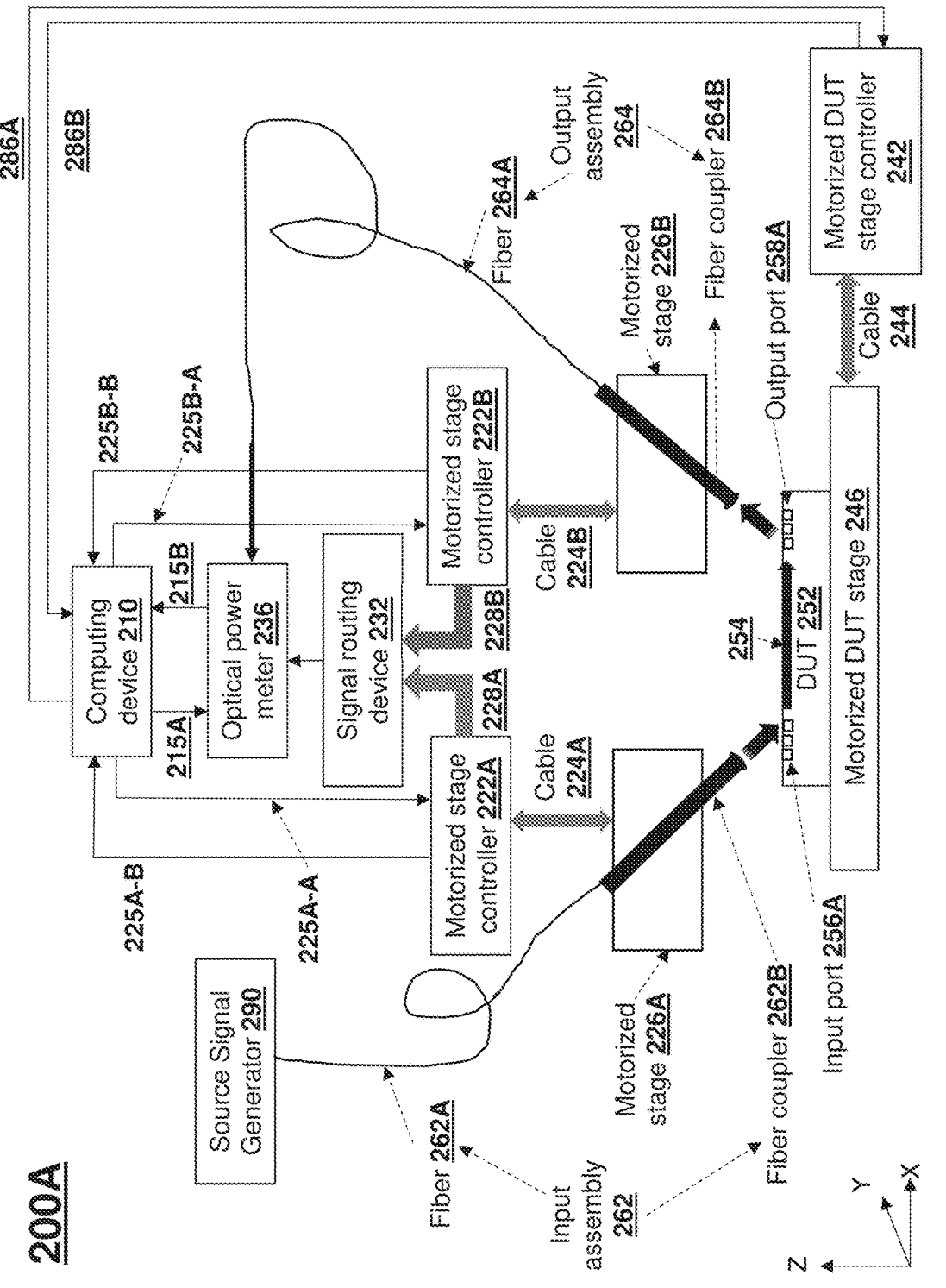
FIGS. 2A-2D illustrate exemplary systems for testing a photonic device in accordance with some embodiments of the present document.

FIGS. 2A through 2D illustrate exemplary systems for testing a photonic device in accordance with some embodiments of the present document. The system 200A as illustrated in FIG. 2A including a computing device 210, an input fiber positioning assembly including a motorized stage controller 222A and a motorized stage 226A, an output fiber positioning assembly including a motorized stage controller 222B and a motorized stage 226B, a signal acquisition assembly including a signal routing device 232 and an optical power meter 236, a DUT positioning assembly including a motorized DUT stage controller 242 and a motorized DUT stage 246, and a source signal generator 290. For illustrative purposes, a coordinate system is provided in FIGS. 2A-2D, in which an X-axis and a Y-axis are orthogonal to each other and define a horizontal plane of the motorized stage 226A or 226B, and a Z-axis extends orthogonal to the X- and Y-axis.

The computing device 210 may be similar to or substantially the same as the computing device 110 of the system 100, whose descriptions apply here. The input fiber positioning assembly (including the motorized stage controller 222A and the motorized stage 226A) and the output fiber positioning assembly (including the motorized stage controller 222B and the motorized stage 226B) may be similar to or substantially the same as the coupling fiber positioning assembly 120 (including the coupling fiber positioning controller 122 and the motorized coupling fiber positioning stage 126) of the system 100, whose descriptions apply here. The input fiber positioning assembly and the output fiber positioning assembly may be controlled and/or move independently of each other. The signal acquisition assembly (including the signal routing device 232 and the optical power meter 236) may be similar to or substantially the same as the signal acquisition assembly 130 (including the signal routing device 132 and the signal acquisition device 136) of the system 100, whose descriptions apply here. The DUT positioning assembly (including the motorized DUT stage controller 242 and the motorized DUT stage 246) may be similar to or substantially the same as the DUT positioning assembly 140 (including the DUT stage controller 142 and the motorized DUT stage 146) of the system 100, whose descriptions apply here. Overlapping descriptions are not repeated.

A DUT 252 may be positioned on the motorized DUT stage 246. The DUT 252 may be a photonic device. The DUT 252 may include an input port 256A, an on-board optical path 254 (e.g., a waveguide), and an output port 258A. As illustrated, each of the input port 256A and the output port 258A may include a grating coupler through which the DUT 252 may be coupled to an optical component, e.g., a fiber, a fiber coupler, etc.

The input fiber positioning assembly may be configured to position an input assembly 262. The output fiber positioning assembly may be configured to position an output assembly 264. The input assembly 262, the DUT 252, and the output assembly 264 may be positioned to collectively form an optical pathway through which a source signal may propagate for testing the DUT 252. The configuration of the optical pathway may be adjusted by adjusting the placement of the input assembly 262 (or a portion thereof), the placement of the output assembly 264 (or a portion thereof), the placement of the DUT 252, etc.

The input assembly 262 may include an input fiber 262A and an input fiber coupler 262B. The input fiber 262A may be coupled to the source signal generator 290 to receive a source signal generated by the source signal generator 290. The signal after exiting the input assembly 262 may enter an optical device downstream of the input assembly 262, e.g., the DUT 252 (e.g., a photonic device) via the input port 256A of the DUT 252. The input fiber coupler 262B may be secured on the motorized stage 226A of the input fiber positioning assembly so that movement of the stage 226A may adjust the placement of the input assembly 262 (e.g., the input fiber coupler 262B), which in turn may change the configuration of the optical pathway.

The output assembly 264 may include an output fiber 264A and an output fiber coupler 264B. The output fiber 264A may be coupled to the optical power meter 236 that is configured to detect a test signal derived from propagation of the source signal generated by the source signal generator 290 through the optical pathway. The output fiber coupler 264B may be secured on the motorized stage 226B of the output fiber positioning assembly so that movement of the stage 226B may adjust the placement of the output assembly 264 (e.g., the output fiber coupler 264B), which in turn may change the configuration of the optical pathway.

The configuration of the optical pathway (formed by the input assembly 262, the DUT 252, and the output assembly 264) may be adjusted by adjusting at least one of the components of the optical pathway. The computing device 210 may be configured to provide information 225A-A (e.g., control commands) to and receive feedback 225A-B from the motorized stage controller 222A (e.g., feedback relating to execution of the control commands and/or the operation or condition of itself or a component connected to it). In response to a received control commend, the motorized stage controller 222A may transmit an input fiber positioning actuating signal via a cable 224A to move the motorized stage 226A so that the input assembly 262 connected thereto may be adjusted. Similarly, the computing device 210 may be configured to provide information 225B-A (e.g., control commands) to and receive feedback 225B-B from the motorized stage controller 222B (e.g., feedback relating to execution of the control commands and/or the operation or condition of itself or a component connected to it). In response to a received control commend, the motorized stage controller 222B may transmit an output fiber positioning actuating signal via a cable 224B to move the motorized stage 226B so that the output assembly 264 connected thereto may be adjusted.

The motorized stage controller 222A may be connected to both the motorized stage 226A and the signal routing device 232 so that the motorized stage controller 222A may transmit a same actuating signal to both the motorized stage 226A via the cable 224A and the signal routing device 232 via a cable 228A to cause substantially synchronized operations including a movement of the motorized stage 226A and a signal acquisition by the optical power meter 236. The motorized stage controller 222B may be connected to both the motorized stage 226B and the signal routing device 232 so that the motorized stage controller 222B may transmit a same actuating signal to both the motorized stage 226B via the cable 224B and the signal routing device 232 via a cable 228B to cause substantially synchronized operations including a movement of the motorized stage 226B and a signal acquisition by the optical power meter 236. As used herein, a "same" actuating signal to two devices, e.g., both the motorized stage 226A or 226B and the signal routing device 232, indicates that an actuating signal to both devices originates from a single source (the motorized stage controller 222A or 222B) at the same time in response to a same control command. In some embodiments, at each time point, only one of the input assembly 262 or the output assembly 264 may change its placement, while the other remain stationary; accordingly, only one of the controller 222A or 222B receives a control command and generates an actuating signal to cause the corresponding motorized stage 226A or 226B to move.

The computing device 210 may be configured to provide information 286A (e.g., control commands) to and receive feedback 286B from the motorized DUT stage controller 242 (e.g., feedback relating to execution of the control commands and/or the operation or condition of itself or a component connected to it). In response to a received control command from the computing device 210, the motorized DUT stage controller 242 can transmit, via a cable 244, an actuating signal to the motorized DUT stage 246 to cause its movement, thereby adjusting the placement of the DUT 252 secured on the motorized DUT stage 246.

The computing device 210 may provide, via a cable 215A, an instruction to the signal acquisition assembly of the system 200A. Merely by way of example, the computing device 210 may send an instruction directly to the signal routing device 232 and/or the optical power meter 236 to control the operation (e.g., by overwriting an actuating signal from the motorized stage controller 222A or 222B for safety and/or other considerations). The optical power meter 236 may send, via a cable 215B, acquired data (e.g., test signals) to the computing device 210 for storage (e.g., at the storage device(s) 116, or one or more external storage devices) and/or processing (e.g., by the processor(s) 112, or one or more external local or remote processors).

Figure 2B:
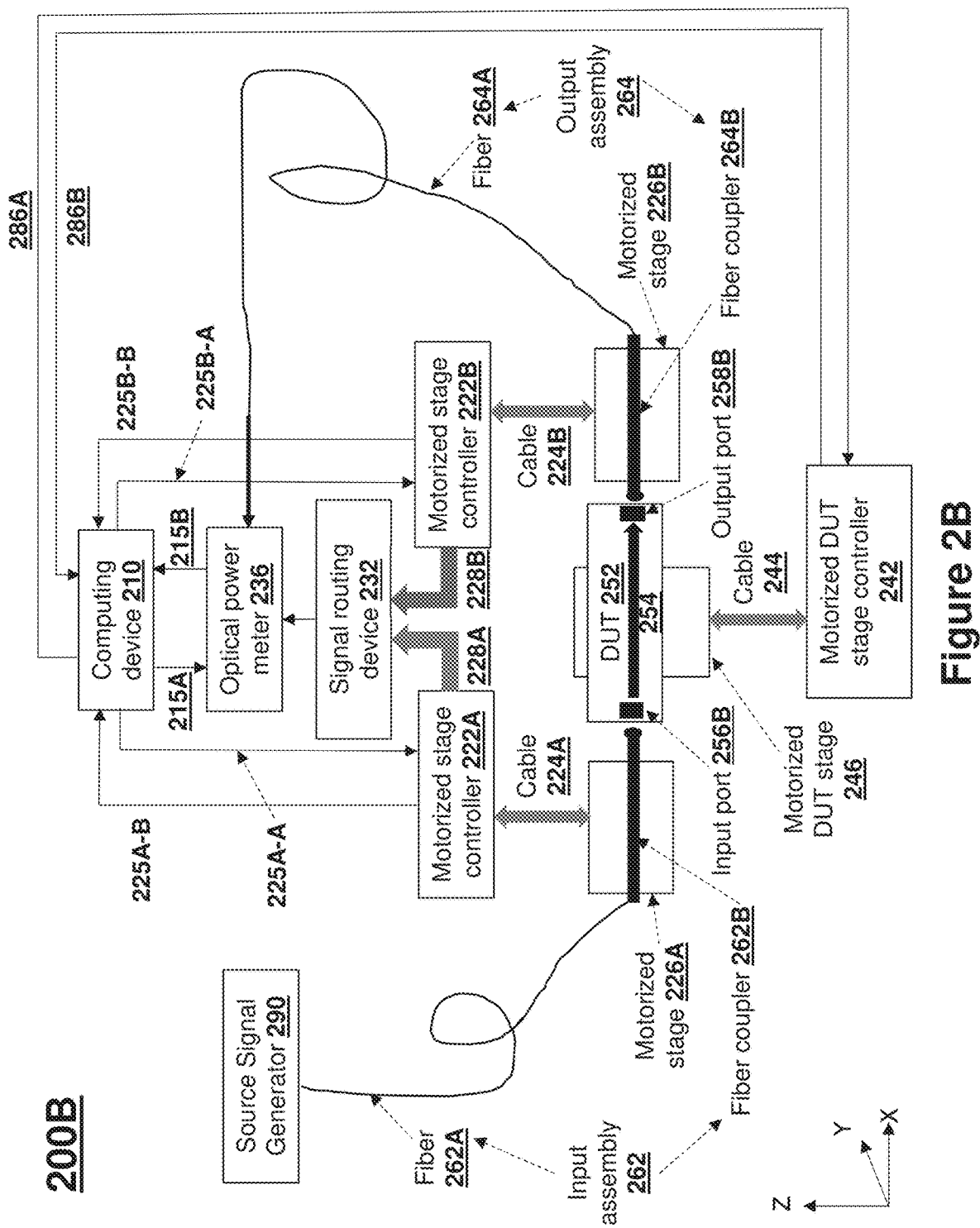

FIG. 2B illustrates a system 200B for testing a photonic device in accordance with some embodiments of the present document. The system 200B is similar to the system 200A, relevant descriptions of which apply here and are not repeated. The system 200B may be configured to test a DUT 252, a photonic device having an input port 256B and an output port 258B. The input port 256B and the output port 258B as illustrated may include edge couplers via which the DUT 252 is connected with an input assembly 262 and an output assembly 264, respectively. The input assembly 262, the DUT 252, and the output assembly 264 may collectively form an adjustable optical pathway. A source signal generated by the source signal generator 290 may propagate through the optical pathway. A test signal derived from the propagation may be detected by the optical power meter 236.

Figure 2C:
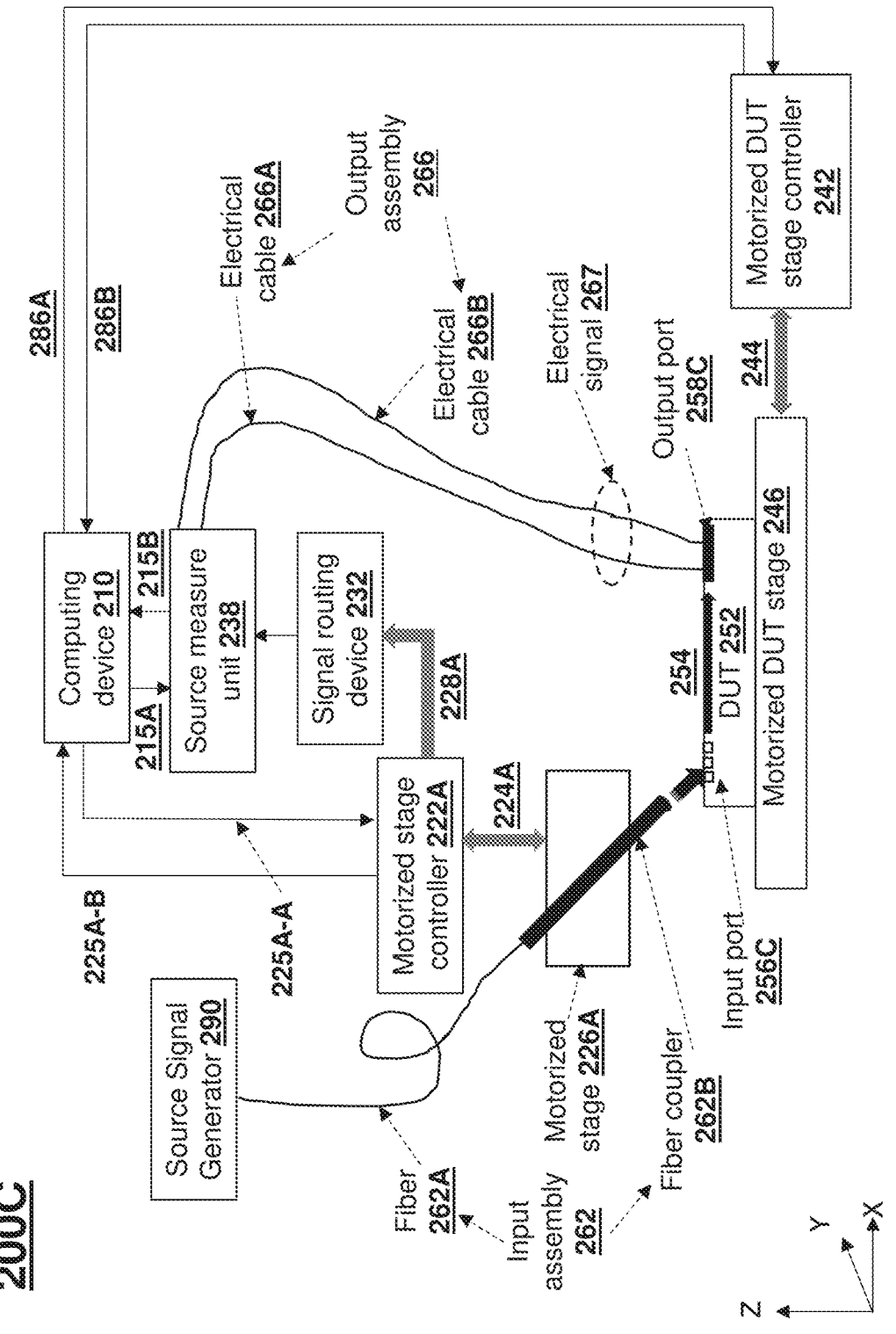

FIG. 2C illustrates a system 200C for testing a photonic device in accordance with some embodiments of the present document. The system 200C is similar to the system 200A, relevant descriptions of which apply here and are not repeated. The system 200C may be configured to test a DUT 252, a photonic device having an input port 256C and an output port 258C. The input port 256C as illustrated may include a grating coupler via which the DUT 252 is connected with an input assembly 262. The output port 258C as illustrated may include a photodetector via which the DUT 252 is connected with an output assembly 266. The photodetector may be a photodiode, an avalanche photodiode (APD), a phototransistor, etc. The output assembly 264 may include one or more electrical cables. The input assembly 262 and the DUT 252 may collectively form an adjustable optical pathway. A source signal generated by the source signal generator 290 may propagate through the optical pathway. An optical signal derived from the propagation may be converted to the electrical signal 267 for transfer via the output assembly 266 to and detection by a source measure unit 238. The output assembly 266 may include one or more electrical cables 266A and 266B.

Figure 2D:
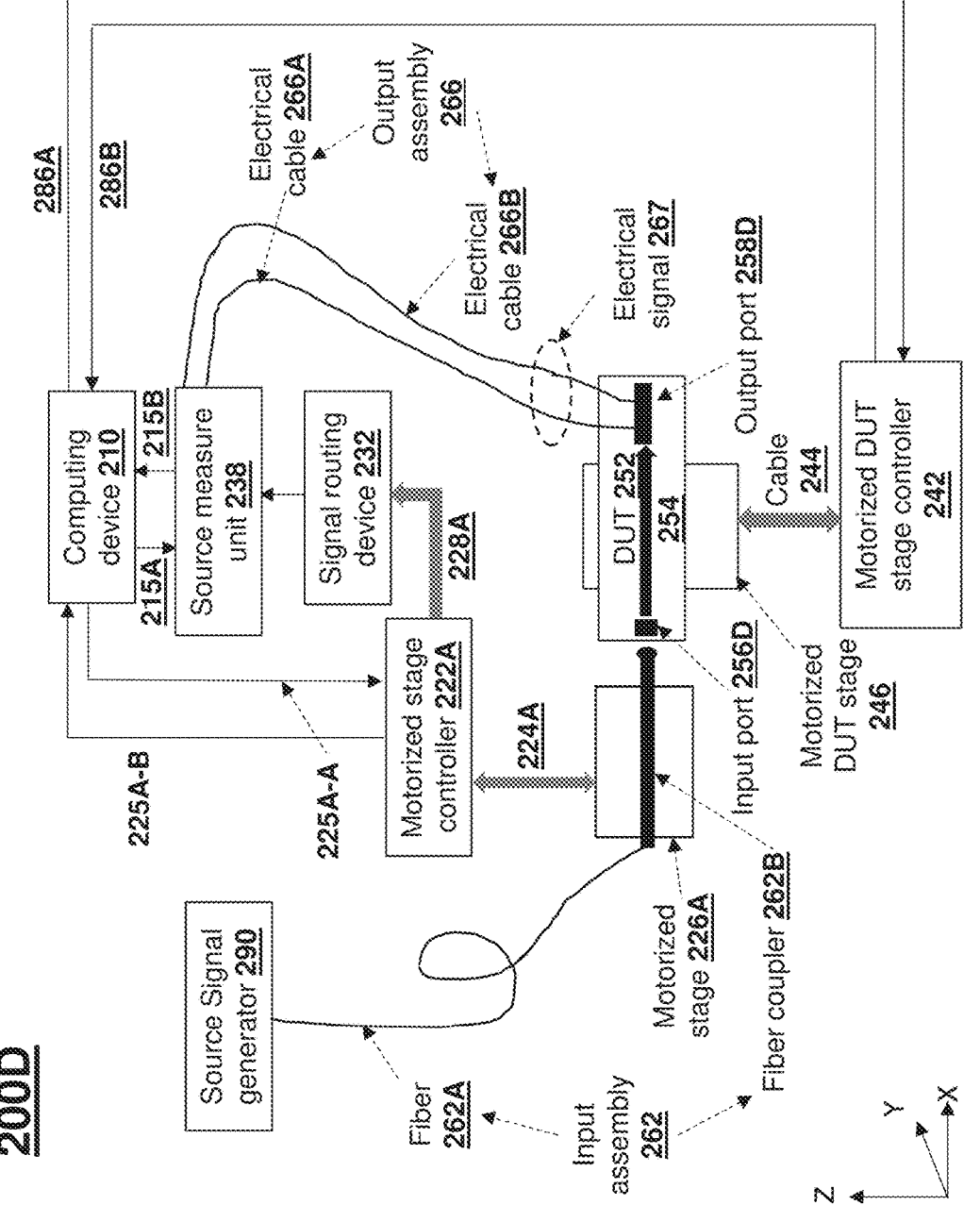

FIG. 2D illustrates a system 200D for testing a photonic device in accordance with some embodiments of the present document. The system 200D is similar to the system 200A, relevant descriptions of which apply here and are not repeated. The system 200D may be configured to test a DUT 252, a photonic device having an input port 256D and an output port 258D. The input port 256D as illustrated may include an edge coupler via which the DUT 252 is connected with an input assembly 262. The output port 258D as illustrated may include a photodetector via which the DUT 252 is connected with an output assembly 264. The photodetector may be a photodiode, an avalanche photodiode (APD), a phototransistor, etc. The output assembly 264 may include one or more electrical cables. The input assembly 262 and the DUT 252 may collectively form an adjustable optical pathway. A source signal generated by the source signal generator 290 may propagate through the optical pathway. An optical signal derived from the propagation may be converted to the electrical signal 267 for detection by a source measure unit 238.

The system 200 (individually illustrated as the system 200A, the system 200B, the system 200C, and the system 200D in FIGS. 2A-2D) may perform an automated and continuous testing procedure. The computing device 210 may obtain an operational instruction regarding the testing. For example, the operational instruction may include information relating to various configurations of the optical pathway to be tested. In some embodiments, the optical pathway may be formed by components including the input assembly 262 and the DUT 252. In some embodiments, the optical pathway may be formed by components including the input assembly 262, the DUT 252, and the output assembly 264. Various configurations of the optical pathway may be achieved by adjusting one or more components of the optical pathway. For example, for a specific DUT 252 and a specific placement of the output assembly 264, the motorized stage 226A may traverse a series of test positions so that various placements of the input assembly 262 may be achieved and configurations of the corresponding optical pathways may be tested. As another example, for a specific DUT 252 and a specific placement of an input assembly 262, the motorized stage 226B may traverse a series of test positions so that various placements of the output assembly 264 may be achieved and configurations of the corresponding optical pathways may be tested.

Merely by way of example, for a testing procedure, the computing device 210 may generate a series of control commands based on an operational instruction. The computing device 210 may transmit the controller commands to the motorized stage controller 222A. Based on a controller command, the controller commands to the motorized stage controller 222A may generate an actuating signal configured to trigger two actions, one action by the motorized stage 226A to move the input assembly 262, and the other action by the optical power meter 236 to acquire a test signal. The two actions triggered by a same actuating signal (and corresponding to a same control command) may occur substantially simultaneously. The group of operations including receiving a control command, generating an actuating signal, and synchronized operations of the motorized stage 226A and the optical power meter 236 may repeat continuously without interruption. A cycle of the group of operations may generate a signal configuration pair including a test signal and the corresponding configuration information of the optical pathway. Each cycle may be initiated by a new control command. The system 200 may perform multiple cycles and obtain multiple signal configuration pairs for storage (e.g., at the storage device(s) 116, or one or more external storage devices) and/or processing (e.g., by the processor(s) 112, or one or more external local or remote processors). This is different from an existing process in which in one cycle, the operation of the motorized stage and the operation of the signal acquisition device are controlled separately such that the two operations occur one after another (e.g., signal acquisition occurs after the movement is complete), and therefore is much more time-consuming.

Figure 3:
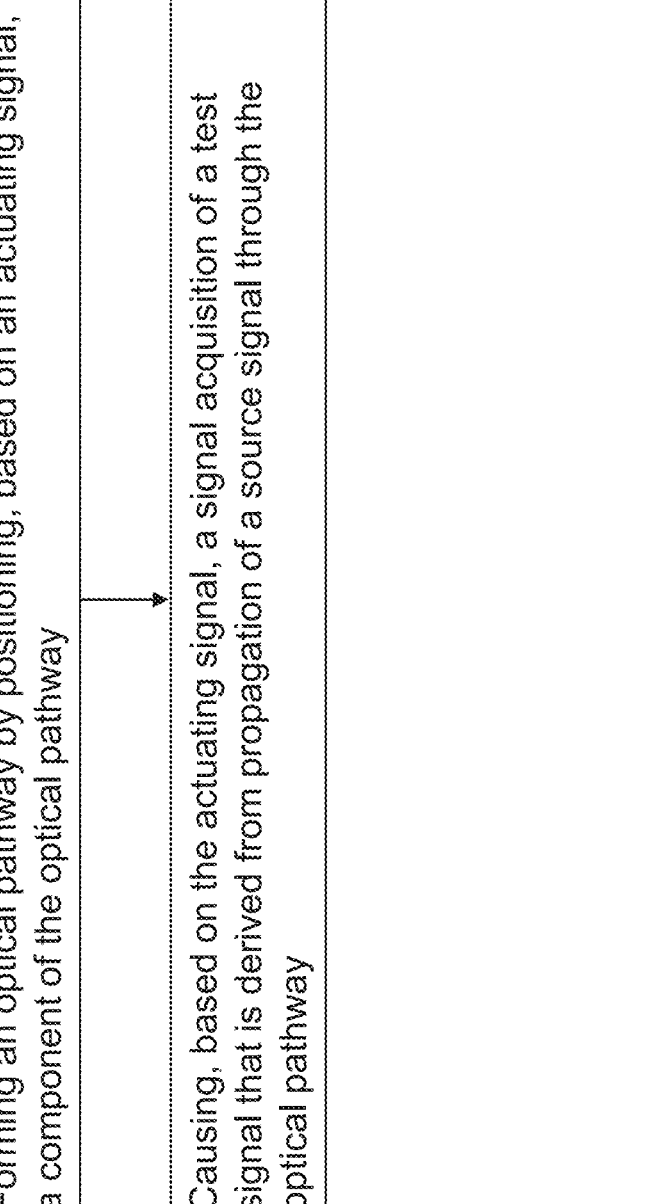
FIG. 3 illustrates a flowchart of a process for testing a photonic item according to some embodiments of the present document.

FIG. 3 illustrates a flowchart of a process for testing a photonic item according to some embodiments of the present document. The process 300 may be implemented on a system disclosed elsewhere in the present document including, e.g., the system 100 or 200. For illustration purposes and not intended to be limiting, the process 300 is described with reference to the system 100.

At 310, the system 100 may form an optical pathway by positioning, based on an actuating signal, a component of the optical pathway. The optical pathway may be formed by at least one coupling fiber (e.g., the input assembly 262 as illustrated in FIGS. 2A-2D, the output assembly 264 as illustrated in FIGS. 2A and 2B) and the photonic item (e.g., the DUT 252 as illustrated in FIGS. 2A-2D). In some embodiments, the component to be positioned may include a coupling fiber connected to the coupling fiber positioning assembly 120. The coupling fiber positioning controller 122 of the system 100 may send the actuating signal to the coupling fiber positioning assembly 120, causing the coupling fiber positioning assembly 120 to position the coupling fiber.

Merely by way of example, the coupling fiber positioning controller 122 may generate the actuating signal based on a control command from the computing device 110 of the system 100. The coupling fiber positioning controller 122 may send the actuating signal to the coupling fiber positioning actuator 127B. Upon receiving the actuating signal, the coupling fiber positioning actuator 127B may convert it into mechanical motion, moving the coupling fiber positioning stage 127A in a predetermined manner. The mechanical motion of the coupling fiber positioning actuator 127B may cause the coupling fiber positioning stage 127A to move in one or more of the six degrees of freedom (e.g., three-dimensional space ranges in x, y, z, roll angle, yaw angle, and pitch angle). For example, the coupling fiber positioning stage 127A may move in one direction. As another example, the coupling fiber positioning stage 127A may move in two or more directions (e.g., moving in a direction at 45 degrees from the X-axis). The coupling fiber secured on the coupling fiber positioning stage 127A may be caused to move accordingly in one or more directions of the six degrees of freedom, resulting in a placement of the coupling fiber to align with the photonic device, thereby establishing the optical pathway.

At 320, the system 100 may cause, based on the actuating signal, a signal acquisition of a test signal. The coupling fiber positioning controller 122 of the system 100 may send the actuating signal to the signal acquisition assembly 130. The test signal may be derived from propagation of a source signal through the optical pathway. The source signal may be generated by the source signal generator 190. For example, the computing device 110 may provide an instruction to the source signal generator 190 to generate the source signal. The source signal may enter the optical pathway via the coupling fiber and propagate along the optical pathway, thereby producing the test signal detected by the signal acquisition device 136.

While propagating through the optical pathway, the source signal may attenuate due to one or more factors including, e.g., insertion loss, propagation loss, or the like, or a combination thereof, leading to the test signal. Accordingly, the difference between the source signal and the test signal may reflect the attenuation, on the basis of which the signal loss characteristics of the optical pathway and/or the photonic device may be determined. For example, a signal loss may be determined based on the test signal and the corresponding source signal. The system 100 may obtain a signal configuration pair including the test signal and corresponding configuration information of the optical pathway for storage (e.g., at the storage device(s) 116, or one or more external storage devices) and/or processing (e.g., by the processor(s) 112, or one or more external local or remote processors).

The signal acquisition may proceed substantially simultaneously with the positioning of the component, both of which occur in response to the same actuating signal. Compared to an existing control method in which signal acquisition and positioning of the coupling fiber are controlled separately and occur one after another, the control scheme in some embodiments of the present document may lead to a more efficient and synchronized operation of the signal acquisition and the component positioning, and/or a higher precision in the alignment of the coupling fiber with the photonic item and/or other components of the optical pathway.

FIG. 4 illustrates a flowchart of a process for testing a photonic item according to some embodiments of the present document. The process 400 may be implemented on a system disclosed elsewhere in the present document including, e.g., the system 100 or 200. For illustration purposes and not intended to be limiting, the process 400 is described with reference to the system 100.

At 402, the system 100 (e.g., the computing device 110) may obtain an operational instruction regarding a testing of a photonic item. The photonic item may include a photonic integrated circuit (PIC). The testing may be performed to assess the functionality or performance of the photonic item at the die-level or the wafer-level, to identify a desirable packaging configuration (e.g., identifying a desired alignment of the photonic item with an upstream or downstream optical component such as an optical fiber, a lens, a connector, etc.) as part of a packaging process, or the like, or a combination thereof. To perform the testing, the photonic item may be integrated with one or more other optical components (e.g., an optical fiber, a lens, a connector, etc.) to collectively form an optical pathway. The operational instruction may include information relating to space ranges (e.g., three-dimensional space ranges in x, y, z, roll angle, yaw angle, and pitch angle) of at least one component of the optical pathway, an incremental displacement of at least one component of the optical pathway, or the like, or a combination thereof. In some embodiments, the operational instruction may indicate possible configurations of an optical pathway including the photonic item, or a portion thereof (e.g., one or more optical components connected to the photonic item) in an intended use of the photonic item (or a similar item such as a photonic item manufactured in a similar way or in a same batch).

Based on the operational instruction, the system 100 (e.g., the computing device 110) may generate a plurality of control commands to guide the system 100 in executing the testing iteratively. In this iterative process, each step may involve moving an adjustable optical component by an incremental displacement. For example, based on the plurality of control signals, the coupling fiber positioning stage 127A may sweep through a series of test positions to position the attached coupling fiber within the space ranges specified in the operational instruction. A test position of the coupling fiber positioning stage 127A may correspond to a placement of the coupling fiber and the resulting configuration of the optical pathway.

In some embodiments, the system 100 (e.g., the computing device 110) may generate, based on the operational instruction, a plurality of control commands iteratively one at a time. After the system 100 generates and executes a control command, the system 100 may generate a next control command based on at least one type of information including the operational instruction, feedback about execution of the preceding control command(s), sensor data on the position of the coupling fiber positioning stage 127A and/or the placement of the coupling fiber, or the like, or a combination thereof. The control scheme may allow for an adjustment based on the outcomes of one or more previous step(s), and/or management and/or correction of an error or an unexpected result in real-time. In some embodiments, the system 100 (e.g., the computing device 110) may generate, based on the operational instruction, a plurality of control commands in a batch and execute them one after another. The control scheme may allow for continuous execution without pauses for decision-making between steps. In some embodiments, the system 100 (e.g., the computing device 110) may employ a hybrid approach in which the system 100 (e.g., the computing device 110) may generate and execute certain sequences of control commands in batches, with decision points incorporated to assess results and make adjustments as needed. This control scheme may combine the efficiency of batch processing with the adaptability of iterative execution. The division of the batches may be determined based on the space ranges (e.g., each batch corresponding to a certain space range), the operational instruction (e.g., each batch corresponding to a certain steps), or the outcome of one or more steps (e.g., the error or unexpected result in one step, the cumulative error of multiple steps).

At 406, the system 100 (e.g., the coupling fiber positioning controller 122) may obtain a control command relating to the operational instruction. The control instruction may include information relating to a test position for the coupling fiber positioning stage 127A, a corresponding placement of the coupling fiber attached to the stage 127A, or an incremental displacement of the stage 127A to be achieved based on the control command. If the system 100 employs an iterative process for generating the control commands, the system 100 may generate a new control command. For example, the computing device 110 may generate the new control command based on at least one type of information including the operational instruction, feedback about execution of the preceding control command(s), sensor data on the position of the coupling fiber positioning stage 127A and/or the placement of the coupling fiber, or the like, or a combination thereof. The computing device 110 may transmit the new control command to the coupling fiber positioning controller 122 for execution. If the system 100 employs a batch process for generating the control commands, the system 100 may retrieve a new control command for execution. For example, after executing a control command as described in 408-430 below, the coupling fiber positioning controller 122 may retrieve a new control command from the computing device 110, or from a storge device of the coupling fiber positioning controller 122 for execution. If the system 100 employs a hybrid approach for generating the control commands, the system 100 may either generate a new control command or retrieve a predetermined new control command. For example, the computing device 110 may determine whether a new control command is available for retrieval or needs to be generated and proceed accordingly. Based on the new control command, the coupling fiber positioning controller 122 may cause operations 408-430 to be performed as described below. Regardless of whether the control commands are generated iteratively, in a batch mode, or in a hybrid mode, the system 100 may generate the control commands based on the operational instruction continuously and automatically, without a user intervention.

At 408, the system 100 (e.g., the coupling fiber positioning controller 122) may generate an actuating signal in response to the control command. Merely by way of example, the actuating signal may include a pulse. In some embodiments, the actuating signal may be configured for triggering operations by the coupling fiber positioning actuator 127B and the signal acquisition device 136.

At 410, the system 100 may form, based on the actuating signal, a candidate optical pathway by positioning an adjustable component. The adjustable component may include the coupling fiber attached to the coupling fiber positioning stage 127A, which in turn is attached to the coupling fiber positioning actuator 127B. The operation of the coupling fiber positioning actuator 127B can be influenced by one or more characteristics of the actuating signal including, e.g., the pulse width, the pulse amplitude, or the like, or a combination thereof. The operation 410 may be similar to or substantially the same as the operation 310, relevant descriptions of which apply here and are not repeated.

At 420, the system 100 may acquire, based on the actuating signal, a test signal. The test signal may be derived from propagation of a source signal through the candidate optical pathway. The operation 420 may be similar to or substantially the same as the operation 320, relevant descriptions of which apply here and are not repeated.

At 430, the system 100 may record a signal configuration pair including the test signal and corresponding configuration information of the candidate optical pathway. The configuration information may include placement of one or more components of the optical pathway, information on the basis of which the placement of the one or more components may be determined, or the like, or a combination thereof. Merely by way of example, after the adjustment of the adjustable component as described in 410, the recorded configuration information may include the corresponding control command from the computing device 110 to the coupling fiber positioning assembly 120 that defines the displacement to be achieved in the operation, the displacement actually achieved in the operation as indicted in a feedback message from the coupling fiber positioning assembly 120 to the computing device 110, sensor data on the position of the coupling fiber positioning stage 127A and/or the placement of the coupling fiber, or the like, or a combination thereof. The test signal may be transmitted to the computing device 110 (e.g., the processor(s) 112, or the storage device(s) 116) once it is acquired or as part of a batch after multiple iterations of the operations 406-430 are performed. Merely by way of example, the signal acquisition device 136 may include a storage device where one or more test signals may be stored before the test signal(s) being transferred to the computing device 110 for storage and/or processing.

At 440, the system 100 may determine whether to continue the testing. For example, the system 100 may determine whether the sweep through the space ranges specified in the operational instruction have been completed, whether all available control commands have been executed, whether the coupling fiber positioning stage 127A has traversed all the test positions corresponding to the operational instruction, etc.

If the system 100 determines that the testing needs to continue, the system 100 may return to 406 to obtain a new control command and proceed to 408 through 430 as described above. In some embodiments, in response to each control command obtained at 406, the coupling fiber positioning controller may generate an actuating signal at 408, and the coupling fiber positioning actuator 127B may undergo a mechanical motion which in turn causes the coupling fiber positioning stage 127A to move in one or more of the six degrees of freedom (e.g., three-dimensional space ranges in x, y, z, roll angle, yaw angle, and pitch angle). For example, the coupling fiber positioning stage 127A may move in one direction per step. As another example, the coupling fiber positioning stage 127A may move in two or more directions per step (e.g., moving in a direction at 45 degrees from the X-axis in one step). The coupling fiber secured on the coupling fiber positioning stage 127A may be caused to move accordingly in one or more directions of the six degrees of freedom per step, resulting in a placement of the coupling fiber to align with the photonic device, thereby establishing a candidate optical pathway corresponding to which a test signal may be acquired. If the system 100 determines that the testing is complete and does not need to continue, the system 100 may proceed to 450.

At 450, the system 100 may determine a target test signal or target configuration information based on the signal configuration pairs. In some embodiments, the system 100 (e.g., the computing device 110) may identify the target test signal from the signal configuration pairs based on a selection condition. For example, the selection condition may specify selecting a highest test signal (or a lowest signal loss between a test signal and its corresponding source signal) among the signal configuration pairs. A highest test signal among the signal configuration pairs may indicate a lowest optical loss. The target test signal may indicate an optimal performance of the photonic item being tested among the tested optical pathway configurations. The test signal may be used to assess the optical performance of the photonic item (or a similar item such as a photonic item manufactured in a similar way or in a same batch). As another example, the selection condition may specify selecting, from the signal configuration pairs, a test signal whose signal loss (between the test signal and its corresponding source signal) is below a signal loss threshold. As a further example, the selection condition may specify selecting a test signal from a set of test signals corresponding to a sequence of test positions of the coupling fiber positioning stage 127A; the set of test signals and their corresponding test positions of the sequence have certain characteristics including that the magnitude of the test signals exceeds a magnitude threshold, indicating desirable optical performance, while the variation in signal magnitude across these test positions remains below a specified threshold, indicating a robustness in the optical pathway configuration. The selection condition may facilitate the identification of a robust optical pathway configuration that provides satisfactory optical performance and is less sensitive to configuration deviations, thus making it more reliable for practical applications. The system 100 (e.g., the computing device 110) may retrieve the configuration information of the candidate optical pathway that corresponds to the identified target test signal and deem it as the target configuration information. The target configuration information may include placement of one or more components of the candidate optical pathway corresponding to the target test signal, e.g., the placement of a coupling fiber forming the candidate optical pathway. The target configuration information may be used to guide the packaging or other use of the photonic item (or a similar item).

In some embodiments, the system 100 (e.g., the computing device 110) may determine the target test signal or target configuration information based on the signal configuration pairs and a model. For example, the system 100 (e.g., the computing device 110) may determine the target configuration information based on a machine learning model and one or more of the signal configuration pairs. Merely by way of example, the machine leaning model may be trained based on training data from prior testing or use of the photonic item or other photonic items. The target configuration information so determined may guide assessment of the performance of the photonic item (or a similar item), or the packaging or other use of the photonic time (or a similar item). For example, the system 100 may compare the target test signal with a condition, e.g., a quality control criterion that specifies a minimum signal magnitude for a satisfactory photonic item, and determine whether the photonic item (or a similar item) meets the quality control criterion. As another example, the system 100 may generate, based on the target configuration information, guidance or specifications for integrating the photonic item (or a similar item) into another device. The guidance or specifications may include information on placement of the photonic item (or a similar item), input assembly, and/or output assembly within such a device to achieve satisfactory or enhanced performance of the photonic item and/or the device. The photonic item (or a similar item) may be integrated into such a device following the guidance or specifications.

According to the process 400, the signal acquisition at 420 may proceed substantially simultaneously with the positioning of the adjustable component at 410, both of which occur in response to the same actuating signal generated at 408, regardless of whether the control commands are generated iteratively, in a batch mode, or in a hybrid mode. Compared to an existing control method in which signal acquisition and positioning of the coupling fiber are controlled separately and occur one after another, the control scheme in some embodiments of the present document may lead to a more efficient and synchronized operation of the signal acquisition and the component positioning, and/or a higher precision in the alignment of the coupling fiber with the photonic item and/or other components of the optical pathway.

FIG. 5 illustrates a flowchart of a process for testing a photonic item according to some embodiments of the present document. The process 500 may be implemented on a system disclosed elsewhere in the present document including, e.g., the system 100 or 200. For illustration purposes and not intended to be limiting, the process 500 is described with reference to the system 200A or 200B for testing the DUT 252.

At 510, a first motorized stage (e.g., the motorized stage 226A where the input assembly 262, or a portion thereof (e.g., the input fiber coupler 262B) is secured) moves in the direction along the X-axis (or referred to as along the X-direction for brevity) continuously within a specified distance range and sends synchronized electrical signals (e.g., actuating signals including pulses) to an optical power meter (e.g., the optical power meter 236) via an electrical signal multiplexer (e.g., the signal routing device 232).

At 520, the optical power meter (e.g., the optical power meter 236) records optical signals (e.g., test signals) in substantial synchronization with the electrical signals (e.g., actuating signals including pulses) from the first motorized stage (e.g., the motorized stage 226A).

At 530, the test process 500 retrieves the optical signal data (e.g., the test signals) from the optical power meter memory (e.g., the memory of the optical power meter 236) after stage movement of the first motorized stage (e.g., the motorized stage 226A) is compete and processes the test data (e.g., signal configuration pairs) to determine an optimal position in the X-direction through, e.g., a mathematical algorithm (e.g., a selection condition, a model).

At 540, the first motorized stage (e.g., the motorized stage 226A) moves to the optimal position in the X-direction determined through the operations 510-530.

At 550, the first motorized stage (e.g., the motorized stage 226A) repeats the similar operations 510-530 in the direction along the Y-axis (or referred to as along the Y-direction for brevity) and then moves to optimal position in the Y-direction after its optimal position in the Y-direction is determined. Thereby, the first motorized stage (e.g., the motorized stage 226A) completes its position optimization in both the X-direction and the Y-direction. In some embodiments, the stage movement of the first motorized stage (e.g., the motorized stage 226A) combines two or more alignment freedom together, such as X and Y to improve alignment efficiency.

At 560, the first motorized stage (e.g., the motorized stage 226A) repeats the similar operations 510-530 to optimize its position in the direction along the Z-axis (or referred to as along the Z-direction for brevity) and 3 rotation orientations including the roll angle, the yaw angle, and the pitch angle to determine its optimal position in the X direction, the Y direction, the Z direction, the roll angle, the yaw angle, and the pitch angle.

At 570, a second motorized stage (e.g., the motorized stage 226B where the output assembly 264, or a portion thereof (e.g., the output fiber coupler 264B) is secured) repeats the similar operations 510-560 in the X direction, the Y direction, the Z direction, the roll angle, the yaw angle, and the pitch angle, and moves to its optimal position. In some embodiments, the stage movement of the second motorized stage (e.g., the motorized stage 226B) combines two or more alignment freedom together, such as X and Y to improve alignment efficiency.

At 580, both the first and second motorized stages complete their position optimization, and the optical signal through the DUT 252, or the optical pathway including the DUT 252, is deemed to reach its peak.

The process 500 may proceed according to an operational instruction specifying a testing of the DUT 252. More description regarding the operational instruction may be found elsewhere in the present document. See, e.g., relevant description regarding 402 which applies here and not repeated. The computing device 210 may generate a plurality of control commands iteratively, in a batch mode, or in a hybrid mode, as described elsewhere in the present document. See, e.g., relevant description regarding 402 which applies here and not repeated. The signal acquisition (e.g., at 520) may proceed substantially simultaneously with the positioning of the first or second motorized stage (e.g., at 510), both of which occur in response to same actuating signals, regardless of whether the control commands are generated iteratively, in a batch mode, or in a hybrid mode. The data analysis at 530 occurs after the first or second motorized stage traverses multiple test positions along at least one direction. Compared to an existing control method in which signal acquisition and positioning of the coupling fiber are controlled separately and occur one after another, the control scheme in some embodiments of the present document may lead to a more efficient and synchronized operation of the signal acquisition and the component positioning, and/or a higher precision in the alignment of the coupling fiber with the photonic item and/or other components of the optical pathway.

It is understood that the process 500 is described with respect to the system 200A and 200B for illustration purposes and not intended to be limiting. The process 500 may be modified without departing from the scope of the present document. For example, the process 500 may be implemented on the system 200C or 200D in which test signals may be acquired using a source measure unit 238, in which the test signals may including electrical signals corresponding to optical signals at the outport port of the DUT 252.

To illustrate technical benefits of the present disclosure, the following example is provided with reference to an on wafer tester. In a two-dimensional wafer plane defined by the X and Y axes, assuming 100 data points are needed to scan in the X direction, the computing device 210 may send control commands to the motorized stage controller 222A which drives, based on actuating signals (e.g., electrical pulses in response to the control commands) the motorized stage 226A to move in the X direction continuously before completing 100 movement steps. The motorized stage controller 222A substantially synchronously sends the actuating signals (e.g., electrical pulses) to the signal routing device 232, which triggers the optical power meter 236 (or source measure unit 238) to measure the optical (or electrical) signals. The motorized stage 226A moves 100 steps in the X direction and the motorized stage controller 222A sends 100 electrical pulses to the optical power meter 236 (or source measure unit 238) to trigger its measurement actions. At the end of the motorized stage movement the optical power meter 236 (or the source measure unit 238) completes its optical (or electrical) signal measurement with 100 points in its memory. The 100 data points may be read out altogether to the computer memory of the computing device 210 for data processing to determine the optimal coupling position in the X-direction. A similar optimization procedure can be done in the Y-direction. The optimal coupling position can be determined after both the X- and the Y-direction scanning is completed. It is understood that there are many different fiber alignment procedures beside the one exemplified here. Typical ones such as spiral search and sinusoidal search are often used in the industry. As a comparison, according to the conventional optical coupling method, measurement data may be acquired by the optical power meter 236 (or the source measure unit 238) and read out from its memory unit for each stage movement step, which may be repeated 100 times in the X-direction scanning process and repeat another 100 times in the Y-direction.

In an experimental use, compared to a conventional method, a reduction of approximately 60% in coupling time was achieved on the wafer tester through experimental validations. The experimental use involved a simple two-dimensional optical coupling optimization case with a given first light signal (e.g., an optical signal as a source signal). The improvement was realized by adopting the approach disclosed herein. The time saving may be more significant if the optical coupling process becomes more complicated without first light given and needs to cover large search ranges.

Example Solutions

The following solutions are illustrative of several embodiments of the present technology.

Solution 1. A system, comprising:

an input fiber positioning assembly comprising:

an input fiber positioning stage for holding an input fiber and operable to move in space to position the input fiber in a desired position and orientation;

an input fiber positioning actuator configured to engage, and to move, the input fiber positioning stage for positioning the input fiber; and an input fiber positioning controller coupled to the input fiber positioning actuator and configured to control, by transmitting an input fiber positioning actuating signal to the input fiber positioning actuator, a movement of the input fiber positioning stage;

an output fiber positioning assembly comprising:

an output fiber positioning stage for holding an output fiber and operable to move in space to position the output fiber in a desired position and orientation;

an output fiber positioning actuator configured to engage, and to move, the output fiber positioning stage for positioning the output fiber; and an output fiber positioning controller coupled to the output fiber positioning actuator and configured to control, by transmitting an output fiber actuating signal to the output fiber positioning actuator, a movement of the output fiber positioning stage;

a device under test (DUT) stage configured to hold a photonic device under test relative to the input fiber positioning assembly with the photonic DUT to be exposed to incident light from the input fiber and the output fiber positioning assembly with the output fiber to allow the output fiber to collect light from the photonic DUT under illumination of the incident light from the input fiber;

a signal acquisition assembly comprising:

a signal acquisition unit coupled to receive light from the output fiber to detect at least a portion of the light collected from the photonic DUT to generate a test signal that relates to placement of at least one of the input fiber or the output fiber with respect to the photonic DUT; and a signal routing device connected to at least one of the input fiber positioning controller or the output fiber positioning controller and configured to trigger a signal acquisition of the test signal by the signal acquisition unit based on at least one of the input fiber positioning actuating signal or the output fiber positioning actuating signal such that the signal acquisition is substantially synchronized with the movement of the input fiber positioning assembly or the movement of the output fiber positioning assembly; and a storage device configured to obtain at least one of (a) the input fiber positioning actuating signal, a corresponding position of the input fiber positioning stage, or a corresponding placement of the input fiber, (b) the output fiber positioning actuating signal, a corresponding position of the output fiber positioning stage, or a corresponding placement of the output fiber, or (c) the test signal.

Solution 2. The system of any one or more solutions disclosed herein, further comprising a computing device configured to:

receive an operational instruction regarding a plurality of test positions;

generate, based on the operational instruction, a plurality of control commands configured to cause the input fiber positioning controller or the output fiber positioning controller to generate a plurality of input fiber positioning actuating signals or output fiber positioning actuating signals, the plurality of input fiber positioning actuating signals or output fiber positioning actuating signals being configured to cause the input fiber positioning stage or the output fiber positioning stage to sequentially traverse the test positions and substantially simultaneously trigger the signal acquisition assembly to acquire a plurality of test signals corresponding to the respective test positions; and identifying, from the plurality of test signals, (i) a target test signal or (ii) target configuration information including placement of the input fiber, the photonic DUT, or the output fiber.

Solution 3. The system of any one or more solutions disclosed herein, wherein the input fiber positioning controller or the output fiber positioning controller is configured to transmit, to the computing device, in response to each of the plurality of control commands, a feedback signal indicating execution of the control command.

Solution 4. The system of any one or more solutions disclosed herein, further comprising: a DUT positioning actuator; and a DUT positioning controller configured to control, by transmitting a DUT positioning actuating signal to the DUT positioning actuator, movement of the DUT stage.

Solution 5. The system of any one or more solutions disclosed herein, wherein the computing device is further configured to transmit to the DUT positioning controller a DUT positioning control command for causing the DUT positioning controller to generate the DUT positioning actuating signal.

Solution 6. The system of any one or more solutions disclosed herein, wherein the plurality of test positions include a first set relating to the input fiber positioning stage and a second set relating to the output fiber positioning stage.

Solution 7. The system of any one or more solutions disclosed herein, wherein the computing device is configured to determine, for each of the plurality of test signals, a signal loss based on the test signal and a corresponding source signal, and wherein the target test signal corresponds to a lowest signal loss among the plurality of test signals.

Solution 8. The system of any one or more solutions disclosed herein, wherein the computing device is configured to determine, for each of the plurality of test signals, a signal loss based on the test signal and a corresponding source signal, and wherein the target test signal corresponds to a signal loss that is below a signal loss threshold.

Solution 9. The system of any one or more solutions disclosed herein, wherein at least one of the input fiber positioning stage or the output fiber positioning stage is configured to move with six degrees of freedom.

Solution 10. The system of any one or more solutions disclosed herein, further comprising a laser source configured to generate a source signal from which the test signal is derived.

Solution 11. The system of any one or more solutions disclosed herein, wherein the input fiber positioning stage comprises a mounting assembly configured to secure the input fiber on the input fiber positioning stage.

Solution 12. The system of any one or more solutions disclosed herein, wherein the signal routing device comprises a time multiplexer.

Solution 13. A system, comprising:

a coupling fiber positioning assembly comprising:

a coupling fiber positioning stage for holding a coupling fiber and operable to move in space to position the coupling fiber in a desired position and orientation;

a coupling fiber positioning actuator configured to engage, and to move, the coupling fiber positioning stage for positioning the coupling fiber; and a coupling fiber positioning controller coupled to the coupling fiber positioning actuator and configured to control, by transmitting a coupling fiber positioning actuating signal to the coupling fiber positioning actuator, a movement of the coupling fiber positioning stage;

a device under test (DUT) stage configured to hold a photonic device under test relative to the coupling fiber positioning assembly, wherein the photonic DUT and the coupling fiber are coupled to form an optical pathway;

a signal acquisition assembly comprising:

a signal acquisition device configured to acquire, based on the coupling fiber positioning actuating signal, a test signal derived from propagation of a source signal through the optical pathway; and a storage device configured to obtain the test signal and configuration information of the optical pathway, wherein the configuration information relates to coupling of the coupling fiber and the photonic DUT.

Solution 14. The system of any one or more solutions disclosed herein, wherein the signal acquisition assembly further comprises a signal routing device connected to the coupling fiber positioning controller and configured to trigger, in response to the coupling fiber positioning actuating signal, the signal acquisition device to acquire the test signal.

Solution 15. The system of any one or more solutions disclosed herein, wherein the coupling fiber is an input fiber or an output fiber.

Solution 16. The system of any one or more solutions disclosed herein, wherein the coupling fiber positioning assembly is an input fiber positioning assembly configured to adjust the optical pathway by adjusting the input fiber.

Solution 17. The system of any one or more solutions disclosed herein, further comprising an output fiber positioning assembly configured to adjust the optical pathway by adjusting the output fiber.

Solution 18. The system of any one or more solutions disclosed herein, further comprising a computing device configured to perform operations including:

receiving an operational instruction;

generating, based on the operational instruction, a plurality of control commands configured to cause the coupling fiber positioning controller to generate a plurality of coupling fiber positioning actuating signals, the plurality of coupling fiber positioning actuating signals being configured to cause the coupling fiber positioning stage to sequentially traverse a plurality of test positions and substantially simultaneously trigger the signal acquisition assembly to acquire a plurality of test signals corresponding to the respective test positions; and identifying, from the plurality of test signals, (i) a target test signal or (ii) target configuration information including placement of the coupling fiber or the photonic item.

Solution 19. A method, comprising:

forming, based on a first actuating signal, a first candidate optical pathway by adjusting placement of an adjustable component of the first candidate optical pathway;

acquiring, based on the actuating signal, a first test signal, wherein the first test signal is derived from propagation of a source signal through the first candidate optical pathway;

recording a first signal configuration pair including the first test signal and configuration information of the first candidate optical pathway;

forming, based on a second actuating signal, a second candidate optical pathway by adjusting placement of the adjustable component;

acquiring, based on the second actuating signal, a second test signal, wherein the second test signal is derived from propagation of the source signal through the second candidate optical pathway;

recording a second signal configuration pair including the second test signal and configuration information of the second candidate pathway; and determining a target test signal or target configuration information based on the first and second signal configuration pairs.

Solution 20. The method of any one or more solutions disclosed herein, wherein the first test signal is acquired substantially simultaneously with the adjustment of the adjustable component in response to the first actuating signal.

Solution 21. The method of any one or more solutions disclosed herein, further comprising:

obtaining an operational instruction;

generating a first control command and a second control command based on the operational instruction; and causing a controller to generate, based on the first control command and the second control command, the first actuating signal and the second actuating signal, respectively.

Solution 22. The method of any one or more solutions disclosed herein, wherein the controller is connected to an actuator and a signal routing device, the actuator being configured to adjust placement of the adjustable component, and the signal routing device being configured to trigger a signal acquisition device to acquire a test signal.

Solution 23. The method of any one or more solutions disclosed herein, further comprising:

determining a target placement of the adjustable component based on the target configuration information corresponding to the target test signal.

Solution 24. The method of any one or more solutions disclosed herein, wherein determining the target placement of the component comprises:

determining the target configuration information based on a machine learning model and at least one of the first or second signal configuration pair, the target configuration information including a target placement of the adjustable component.

Solution 25. A method, comprising:

forming an optical pathway by positioning, based on an actuating signal, a component of the optical pathway, wherein the component is one of a coupling fiber or a photonic device that collectively form the optical pathway; and causing, based on the actuating signal, a signal acquisition of a test signal that is derived from propagation of a source signal through the optical pathway such that the signal acquisition occurs substantially simultaneously with the adjustment of the component.

Solution 26. The method of any one or more solutions disclosed herein, wherein positioning the component of the optical pathway based on the actuating signal comprises:

providing a control command to a controller;

transmitting, in response to the control command, the actuating signal from the controller to an actuator; and causing, based on the actuating signal, the actuator to move a positioning stage where the component is secured such that a placement of the component is adjusted.

Solution 27. The method of any one or more solutions disclosed herein, wherein causing the signal acquisition comprises:

transmitting, in response to the control command, the actuating signal from the controller to a signal routing device; and causing, by the signal routing device in response to the actuating signal, a signal acquisition device to perform the signal acquisition.

Solution 28. The method of any one or more solutions disclosed herein, further comprising:

recording configuration information of the optical pathway and the test signal, wherein the configuration information of the optical pathway relates to optical coupling of the component as adjusted with at least one of the other components of the optical pathway.

Solution 29. The method of any one or more solutions disclosed herein, wherein the configuration information comprises or relates to the actuating signal, a corresponding position of the positioning stage, or a corresponding placement of the component as a result of the adjustment based on the actuating signal.

Solution 30. A method, comprising:

receiving an operational instruction relating to a plurality of test positions of an input fiber positioning stage;

generating, based on the operational instruction, a plurality of control commands corresponding to the plurality of test positions;

causing, based on the plurality of control commands, a controller to generate a plurality of actuating signals;

causing the input fiber positioning stage to sequentially traverse, by an actuator in response to the plurality of actuating signals, the plurality of test positions;

causing a signal acquisition assembly to acquire, in response to the plurality of actuating signals, a plurality of test signals substantially simultaneously while the input fiber positioning stage sequentially traverses the plurality of test positions, each of the plurality of test signals corresponding to a source signal after the source signal propagates through an optical pathway formed by coupled components including an input fiber secured on the input fiber positioning stage, a photonic item, and an output fiber; and identifying, from the plurality of test signals, (i) a target test signal or (ii) target configuration information of the optical pathway.

Solution 31. The method of one or more solutions described herein, wherein the operational instruction further relates to a plurality of second test positions of an output fiber positioning stage where the output fiber is secured, the method further comprising:

generating, based on the operational instruction, a plurality of second control commands corresponding to the plurality of second test positions;

causing, based on the plurality of second control commands, a second controller to generate a plurality of second actuating signals;

causing the output fiber positioning stage to sequentially traverse, by a second actuator in response to the plurality of second actuating signals, the plurality of second test positions; and causing the signal acquisition assembly to acquire, in response to the plurality of second actuating signals, a plurality of second test signals substantially simultaneously while the output fiber positioning stage sequentially traverses the plurality of second test positions, each of the plurality of second test signals corresponding to the source signal after the source signal propagates through the optical pathway.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any disclosure or of what may be claimed, but rather as descriptions of features that may be specific to particular embodiments of particular disclosure. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A system, comprising:

an input fiber positioning assembly comprising:

an input fiber positioning stage for holding an input fiber and operable to move in space to position the input fiber in a desired position and orientation;

an input fiber positioning actuator configured to engage, and to move, the input fiber positioning stage for positioning the input fiber; and an input fiber positioning controller coupled to the input fiber positioning actuator and configured to control, by transmitting an input fiber positioning actuating signal to the input fiber positioning actuator, a movement of the input fiber positioning stage;

an output fiber positioning assembly comprising:

an output fiber positioning stage for holding an output fiber and operable to move in space to position the output fiber in a desired position and orientation;

an output fiber positioning actuator configured to engage, and to move, the output fiber positioning stage for positioning the output fiber; and an output fiber positioning controller coupled to the output fiber positioning actuator and configured to control, by transmitting an output fiber actuating signal to the output fiber positioning actuator, a movement of the output fiber positioning stage;

a device under test (DUT) stage configured to hold a photonic device under test relative to the input fiber positioning assembly with the photonic DUT to be exposed to incident light from the input fiber and the output fiber positioning assembly with the output fiber to allow the output fiber to collect light from the photonic DUT under illumination of the incident light from the input fiber;

a signal acquisition assembly comprising:

a signal acquisition unit coupled to receive light from the output fiber to detect at least a portion of the light collected from the photonic DUT to generate a test signal that relates to placement of at least one of the input fiber or the output fiber with respect to the photonic DUT; and a signal routing device connected to at least one of the input fiber positioning controller or the output fiber positioning controller and configured to trigger a signal acquisition of the test signal by the signal acquisition unit based on at least one of the input fiber positioning actuating signal or the output fiber positioning actuating signal such that the signal acquisition is substantially synchronized with the movement of the input fiber positioning assembly or the movement of the output fiber positioning assembly; and a storage device configured to obtain at least one of (a) the input fiber positioning actuating signal, a corresponding position of the input fiber positioning stage, or a corresponding placement of the input fiber, (b) the output fiber positioning actuating signal, a corresponding position of the output fiber positioning stage, or a corresponding placement of the output fiber, or (c) the test signal.

2. The system of claim 1, further comprising a computing device configured to:

receive an operational instruction regarding a plurality of test positions;

generate, based on the operational instruction, a plurality of control commands configured to cause the input fiber positioning controller or the output fiber positioning controller to generate a plurality of input fiber positioning actuating signals or output fiber positioning actuating signals, the plurality of input fiber positioning actuating signals or output fiber positioning actuating signals being configured to cause the input fiber positioning stage or the output fiber positioning stage to sequentially traverse the test positions and substantially simultaneously trigger the signal acquisition assembly to acquire a plurality of test signals corresponding to the respective test positions; and identifying, from the plurality of test signals, (i) a target test signal or (ii) target configuration information including placement of the input fiber, the photonic DUT, or the output fiber.

3. The system of claim 2, wherein the input fiber positioning controller or the output fiber positioning controller is configured to transmit, to the computing device, in response to each of the plurality of control commands, a feedback signal indicating execution of the control command.

4. The system of claim 2, further comprising:

a DUT positioning actuator; and a DUT positioning controller configured to control, by transmitting a DUT positioning actuating signal to the DUT positioning actuator, movement of the DUT stage.

5. The system of claim 4, wherein the computing device is further configured to transmit to the DUT positioning controller a DUT positioning control command for causing the DUT positioning controller to generate the DUT positioning actuating signal.

6. The system of claim 2, wherein the plurality of test positions include a first set relating to the input fiber positioning stage and a second set relating to the output fiber positioning stage.

7. The system of claim 2, wherein the computing device is configured to determine, for each of the plurality of test signals, a signal loss based on the test signal and a corresponding source signal, and wherein the target test signal corresponds to a lowest signal loss among the plurality of test signals.

8. The system of claim 2, wherein the computing device is configured to determine, for each of the plurality of test signals, a signal loss based on the test signal and a corresponding source signal, and wherein the target test signal corresponds to a signal loss that is below a signal loss threshold.

9. The system of claim 1, wherein at least one of the input fiber positioning stage or the output fiber positioning stage is configured to move with six degrees of freedom.

10. The system of claim 1, further comprising a laser source configured to generate a source signal from which the test signal is derived.

11. The system of claim 1, wherein the input fiber positioning stage comprises a mounting assembly configured to secure the input fiber on the input fiber positioning stage.

12. The system of claim 1, wherein the signal routing device comprises a time multiplexer.

13. A system, comprising:

a coupling fiber positioning assembly comprising:

a coupling fiber positioning stage for holding a coupling fiber and operable to move in space to position the coupling fiber in a desired position and orientation;

a coupling fiber positioning actuator configured to engage, and to move, the coupling fiber positioning stage for positioning the coupling fiber; and a coupling fiber positioning controller coupled to the coupling fiber positioning actuator and configured to control, by transmitting a coupling fiber positioning actuating signal to the coupling fiber positioning actuator, a movement of the coupling fiber positioning stage;

a device under test (DUT) stage configured to hold a photonic device under test relative to the coupling fiber positioning assembly, wherein the photonic DUT and the coupling fiber are coupled to form an optical pathway;

a signal acquisition assembly comprising:

a signal acquisition device configured to acquire, based on the coupling fiber positioning actuating signal, a test signal derived from propagation of a source signal through the optical pathway; and a storage device configured to obtain the test signal and configuration information of the optical pathway, wherein the configuration information relates to coupling of the coupling fiber and the photonic DUT.

14. The system of claim 13, wherein the signal acquisition assembly further comprises a signal routing device connected to the coupling fiber positioning controller and configured to trigger, in response to the coupling fiber positioning actuating signal, the signal acquisition device to acquire the test signal.

15. The system of claim 13, wherein the coupling fiber is an input fiber or an output fiber.

16. The system of claim 15, wherein the coupling fiber positioning assembly is an input fiber positioning assembly configured to adjust the optical pathway by adjusting the input fiber.

17. The system of claim 16, further comprising an output fiber positioning assembly configured to adjust the optical pathway by adjusting the output fiber.

18. The system of claim 13, further comprising a computing device configured to perform operations including:

receiving an operational instruction;

generating, based on the operational instruction, a plurality of control commands configured to cause the coupling fiber positioning controller to generate a plurality of coupling fiber positioning actuating signals, the plurality of coupling fiber positioning actuating signals being configured to cause the coupling fiber positioning stage to sequentially traverse a plurality of test positions and substantially simultaneously trigger the signal acquisition assembly to acquire a plurality of test signals corresponding to the respective test positions; and identifying, from the plurality of test signals, (i) a target test signal or (ii) target configuration information including placement of the coupling fiber or the photonic item.

19. A method, comprising:

forming, based on a first actuating signal, a first candidate optical pathway by adjusting placement of an adjustable component of the first candidate optical pathway;

acquiring, based on the actuating signal, a first test signal, wherein the first test signal is derived from propagation of a source signal through the first candidate optical pathway;

recording a first signal configuration pair including the first test signal and configuration information of the first candidate optical pathway;

forming, based on a second actuating signal, a second candidate optical pathway by adjusting placement of the adjustable component;

acquiring, based on the second actuating signal, a second test signal, wherein the second test signal is derived from propagation of the source signal through the second candidate optical pathway;

recording a second signal configuration pair including the second test signal and configuration information of the second candidate pathway; and determining a target test signal or target configuration information based on the first and second signal configuration pairs.

20. The method of claim 19, wherein the first test signal is acquired substantially simultaneously with the adjustment of the adjustable component in response to the first actuating signal.

* * * * *